(12) United States Patent
Lee et al.

(10) Patent No.: US 10,955,982 B2
(45) Date of Patent: Mar. 23, 2021

(54) DISPLAY DEVICE AND FABRICATING METHOD THEREOF

(71) Applicant: Samsung Display Co., Ltd., Yongin-si (KR)

(72) Inventors: Dong Sun Lee, Yongin-si (KR); Mu Gyeom Kim, Yongin-si (KR); Young Gug Seol, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/812,931

(22) Filed: Mar. 9, 2020

(65) Prior Publication Data

US 2020/0212150 A1    Jul. 2, 2020

Related U.S. Application Data

(62) Division of application No. 16/228,772, filed on Dec. 21, 2018, now Pat. No. 10,622,425, which is a
(Continued)

(30) Foreign Application Priority Data

Jun. 10, 2016    (KR) .................. 10-2016-0072776

(51) Int. Cl.
*G06F 3/045* (2006.01)
*G06F 3/044* (2006.01)
(Continued)

(52) U.S. Cl.
CPC .......... *G06F 3/0446* (2019.05); *G06F 3/0412* (2013.01); *H01L 27/323* (2013.01);
(Continued)

(58) Field of Classification Search
CPC ...... G06F 3/041; G06F 3/0412; G06F 3/0416; G06F 3/044; G06F 3/0446; G06F 3/045;
(Continued)

(56) References Cited

U.S. PATENT DOCUMENTS 5,459,596 A    10/1995  Ueda et al.
6,730,966 B2    5/2004  Koyama
(Continued)

FOREIGN PATENT DOCUMENTS

KR    10-2008-0002338    1/2008
KR    10-2010-0067761    6/2010
(Continued)

OTHER PUBLICATIONS

Notice of Allowance dated Sep. 21, 2018, in U.S. Appl. No. 15/469,565.
(Continued)

*Primary Examiner* — Joe H Cheng
(74) *Attorney, Agent, or Firm* — H.C. Park & Associates, PLC

(57) ABSTRACT

A display device including an organic light emitting layer, a pixel circuit, and conductive adhesive having a first density and being in electrical communication with the organic light emitting layer and the pixel circuit, wherein during bending certain portions of the conductive adhesive are compressed to a second density higher than the first density and certain other portions of the conductive adhesive are expanded to a third density lower than the first density.

6 Claims, 20 Drawing Sheets

Related U.S. Application Data division of application No. 15/469,565, filed on Mar. 26, 2017, now Pat. No. 10,199,443.

(51) Int. Cl.
*H01L 27/32* (2006.01)
*G06F 3/041* (2006.01)

(52) U.S. Cl.
CPC ...... *H01L 27/3248* (2013.01); *H01L 27/3251* (2013.01); *H01L 27/3262* (2013.01); *G06F 2203/04103* (2013.01); *G06F 2203/04105* (2013.01); *H01L 2227/323* (2013.01)

(58) Field of Classification Search
CPC . G06F 2203/04103; G06F 2203/04105; H01L 27/32; H01L 27/323; H01L 27/3244; H01L 27/3248; H01L 27/3251; H01L 27/3253; H01L 27/3262; H01L 51/56; H01L 2227/323
See application file for complete search history.

(56) References Cited

U.S. PATENT DOCUMENTS

| | | | |
|---|---|---|---|
| 7,821,198 B2 | 10/2010 | Kim et al. | |
| 8,039,288 B2 | 10/2011 | Yamazaki | |
| 8,822,995 B2 | 9/2014 | You et al. | |
| 9,224,667 B2 | 12/2015 | Yamazaki et al. | |
| 10,199,443 B2 * | 2/2019 | Lee | H01L 27/3248 |
| 10,622,425 B2 * | 4/2020 | Lee | H01L 27/3248 |
| 2001/0025958 A1 | 10/2001 | Yamazaki et al. | |
| 2002/0160553 A1 | 10/2002 | Yamanaka et al. | |
| 2003/0013280 A1 | 1/2003 | Yamanaka | |
| 2004/0018797 A1 | 1/2004 | Murakami et al. | |
| 2007/0290196 A1 * | 12/2007 | Fischer | H01L 27/3253 257/40 |
| 2009/0298210 A1 | 12/2009 | Yamazaki et al. | |
| 2010/0182223 A1 | 7/2010 | Choi et al. | |
| 2013/0075761 A1 | 3/2013 | Akiyama | |
| 2013/0162543 A1 | 6/2013 | Behles | |
| 2014/0034921 A1 | 2/2014 | Jinta | |
| 2014/0092034 A1 | 4/2014 | Franklin et al. | |
| 2014/0234998 A1 * | 8/2014 | Kang | H01L 51/5246 438/23 |
| 2016/0062520 A1 | 3/2016 | Choi | |

FOREIGN PATENT DOCUMENTS

| | | |
|---|---|---|
| KR | 10-1048965 | 7/2011 |
| KR | 10-2015-0087058 | 7/2015 |
| KR | 10-1556990 | 10/2015 |
| KR | 10-1579977 | 12/2015 |
| KR | 10-1609376 | 4/2016 |

OTHER PUBLICATIONS

Notice of Allowance dated Dec. 10, 2019, in U.S. Appl. No. 16/228,772.

* cited by examiner

DISPLAY DEVICE AND FABRICATING METHOD THEREOF

CROSS-REFERENCE TO RELATED APPLICATION

This is a Divisional of U.S. patent application Ser. No. 16/228,772, filed Dec. 21, 2018, issued as U.S. Pat. No. 10,622,425 B2, on Apr. 14, 2020, which is a Divisional of U.S. patent application Ser. No. 15/469,565, filed on Mar. 26, 2017, issued as U.S. Pat. No. 10,199,443 B2, on Feb. 5, 2019, and claims priority from and the benefit of Korean Patent Application No. 10-2016-0072776, filed on Jun. 10, 2016, each of which is hereby incorporated by reference for all purposes as if fully set forth herein.

BACKGROUND

Field

The invention relates generally to a display device and method of making the display device, and, more particularly, to a display device and a fabricating method thereof that result in a thinner and more flexible device.

Discussion of the Background

Various types of display devices that display information have been developed. Examples of these display devices may include liquid crystal displays, plasma display panel devices, electrophoretic display devices, and organic light emitting displays.

In general, a display device uses an optically clear adhesive (OCA) to maintain interlayer adhesion between structures stacked over a substrate. Typically, the OCA is situated between a window and a polarization layer such that the light emitted from a pixel layer passes through the OCA after being emitted by the pixel layer. Thus, the OCA is generally optically clear. Also, typically, the various layers are adhered to each other using OCA heat treatment.

However, the optically clear adhesive (OCA) may make it difficult to fold, twist, compress, stretch, roll or otherwise intentionally bend the display device due to differences in materials of interlayer structures at low and high temperatures. In addition, the thickness of the optically clear adhesive (OCA) may prevent the display device from being as thin as it could be if the display device excluded the OCA.

The above information disclosed in this Background section is only for enhancement of understanding of the context of the inventive concepts, and, therefore, it may contain information that does not form the prior art that is already known in this country to a person of ordinary skill in the art.

SUMMARY

One or more exemplary embodiments of the invention provide a thinner and/or a more easily bent display device and a fabricating method thereof. Exemplary methods of manufacture of the apparatus minimize or avoid the use of heat treatment to adhere various layers.

One or more exemplary embodiments provide an adhesive in a location such that light emitted from the pixel layer to a viewer would not typically pass through the adhesive. Accordingly, it is possible in these embodiments to utilize an adhesive material that is not optically clear, i.e. opaque.

Additional aspects will be set forth in the detailed description which follows, and, in part, will be apparent from the disclosure, or may be learned by practice of the inventive concept.

According to one aspect of the invention, a display device includes a first substrate, an organic light emitting layer disposed on the first substrate and including a protrusion, a conductive adhesive disposed on the organic light emitting layer, a pixel circuit disposed on the conductive adhesive and including a passivation film having a recess engaged with the protrusion, and a second substrate disposed on the pixel circuit, wherein the protrusion is located at a position corresponding to the recess and adhered to the organic light emitting layer by the conductive adhesive.

The protrusion may be inserted into the recess.

The organic light emitting layer may include a first electrode disposed on the first substrate, a pixel defining layer disposed on the first substrate and dividing a pixel area, an emitting layer disposed on the first electrode, and a second electrode disposed on the emitting layer, wherein the protrusion is the pixel defining layer.

The pixel area may be provided as a plurality of pixel areas and the second electrode may be disposed to each of the plurality pixel areas.

The first electrode may be an anode and the second electrode may be a cathode.

The pixel circuit may include a thin film transistor disposed on the second substrate, the passivation film disposed on the thin film transistor and including a contact hole through which a portion of a drain electrode of the thin film transistor is exposed, and a contact electrode provided on the passivation film and connected to the drain electrode through the contact hole.

The thin film transistor may include an active pattern disposed on the second substrate, a gate electrode disposed on the active pattern, and a source electrode and a drain electrode connected to the active pattern, wherein the active pattern includes an oxide semiconductor.

The recess may be the contact hole.

The contact electrode may be connected to the organic light emitting layer with the conductive adhesive interposed therebetween.

The conductive adhesive may be disposed in the contact hole.

The conductive adhesive may be disposed on an entire surface of the second substrate.

The display device may further include a touch sensor disposed on the first substrate to sense a touch.

The touch sensor may include sensing electrodes and connection lines connected to the sensing electrodes.

The touch sensor may further include a pressure sensing electrode separated from the sensing electrodes and forming capacitance with the sensing electrodes.

The touch sensor may include a self-capacitance touch sensor.

The touch sensor may be a mutual capacitance touch sensor.

The touch sensor may include a black matrix overlapping with at least one between the sensing electrodes and the connection lines.

The touch sensor may include color filters corresponding to the plurality of pixel regions and displaying different colors.

The conductive adhesive may be an anisotropic conductive film.

The conductive adhesive may be opaque and include an organic polymer and nano-sized conductive particles provided in the organic polymer.

The display device may further include a polarizing layer disposed between the first substrate and the organic light emitting layer.

The polarizing layer may be formed by stacking at least one black metal layer and at least one insulating layer.

The polarizing layer may be formed by stacking a dielectric layer between a first metal layer and a second metal layer.

At least one of the first metal layer and the second metal layer may be a black metal layer.

At least one of the first substrate and the second substrate may have flexibility.

The second substrate may include a metal layer.

According to another aspect of the invention, a method of fabricating a display device includes forming an organic light emitting layer on a first substrate, forming a pixel circuit on a second substrate, forming a conductive adhesive on the pixel circuit, and coupling the organic light emitting layer and the pixel circuit to each other by adhesion through the use of the conductive adhesive.

The step of coupling the organic light emitting layer and the pixel circuit to each other includes disposing the conductive adhesive between the organic light emitting layer and the pixel circuit.

The organic light emitting layer may include a protrusion protruding in a direction of the pixel circuit, the pixel circuit may include a recess, and the protrusion may be inserted into the recess when the organic light emitting layer and the pixel circuit are coupled to each other.

The step of forming of the organic light emitting layer may include forming a first electrode on the first substrate, forming a pixel defining layer dividing a pixel area on the first substrate, forming an organic emitting layer on the first electrode, and forming a second electrode on the organic emitting layer, wherein the protrusion is the pixel defining layer.

The step of pressing may electrically couple the organic light emitting layer and the pixel circuit to each other.

The method of fabricating a display device may further include forming a pressure sensing electrode on a second substrate before forming the pixel circuit.

According to yet another aspect of the invention, a display device may include a first substrate, an organic light emitting layer disposed on the first substrate and including a protrusion, and a pixel circuit including a passivation film having a recess engaged with the protrusion, wherein the protrusion is located at a position corresponding to the recess and adhered to the pixel circuit in the recess by a conductive adhesive.

The conductive adhesive may be disposed on the organic light emitting layer.

The conductive adhesive may be disposed on the organic light emitting layer only at the protrusion, wherein the pixel circuit is disposed on the conductive adhesive, and wherein the protrusion is adhered to the organic light emitting layer by the conductive adhesive only at the corresponding position of the protrusion and recess.

The protrusion may have a bottom, a top and sidewalls connecting the bottom to the top, and the conductive adhesive may be disposed on the organic light emitting layer at a lower level of the bottom of the protrusion, and also on the sidewalls and the top of the protrusion at an upper level, wherein the pixel circuit is disposed on the conductive adhesive, and wherein the protrusion is adhered to the organic light emitting layer by the conductive adhesive at the lower level, at the upper level, and at the sidewalls.

According to yet another aspect of the invention, a flexible display device may include an organic light emitting layer, a pixel circuit, and a conductive adhesive having a first density and being in electrical communication with the organic light emitting layer and the pixel circuit, wherein during bending certain portions of the conductive adhesive are compressed to a second density higher than the first density and certain other portions of the conductive adhesive are expanded to a third density lower than the first density.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concepts, and, together with the description, serve to explain principles of the inventive concepts.

DETAILED DESCRIPTION OF THE ILLUSTRATED EMBODIMENTS

Figure 1:
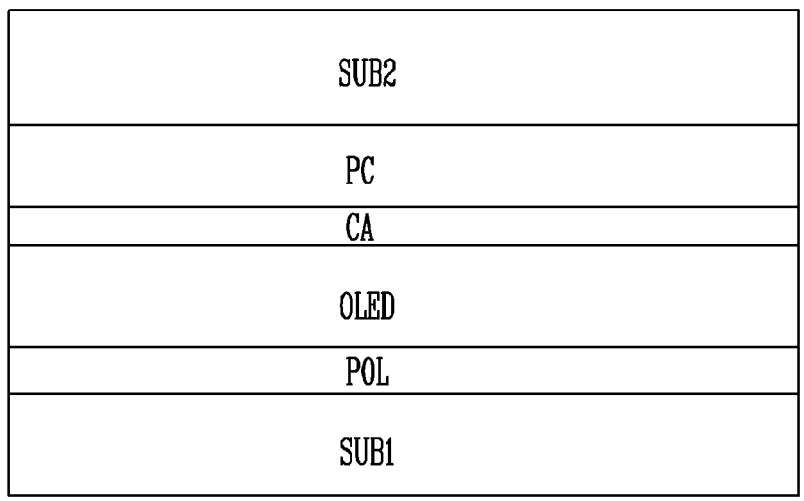
FIG. 1 a schematic cross-sectional view of a display device constructed according to the principles of the invention.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

Unless otherwise specified, the illustrated exemplary embodiments are to be understood as providing exemplary features of varying detail of various exemplary embodiments. Therefore, unless otherwise specified, the features, components, modules, layers, films, panels, regions, and/or aspects of the various illustrations may be otherwise combined, separated, interchanged, and/or rearranged without departing from the disclosed exemplary embodiments. Further, in the accompanying figures, the size and relative sizes of layers, films, panels, regions, etc., may be exaggerated for clarity and descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. Further, the DR1-axis, the DR2-axis, and the DR3-axis are not limited to three axes of a rectangular coordinate system, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

The exemplary embodiments of the invention are describe in relation to a display device but are applicable to any electronic device capable of displaying an "image." The display device according to various exemplary embodiments described herein is usable in connection with various electronic devices including cellular phones, smartphones, laptop computers, personal digital assistants (PDAs), portable multimedia players (PMPs), navigations, slate Pcs, table Pcs, ultrabooks, and wearable devices, such as smartwatches, smart glasses and head mounted displays.

Referring to FIG. 1, a display device according to an exemplary embodiment may include a first substrate SUB1, a polarizing layer POL, an organic light emitting layer OLED, a pixel circuit PC, and a second substrate SUB2. The first substrate SUB1 and the second substrate SUB2 may be bonded to each other by a conductive adhesive CA.

The first substrate SUB1 may include a material which transmits light, for example, a transparent insulating material. The first substrate SUB1 may include a rigid substrate or a flexible substrate. For example, in various exemplary embodiments, the rigid substrate may include at least one of a glass substrate, a quartz substrate, a glass ceramic substrate and a crystalline glass substrate. Similarly, in various exemplary embodiments, the flexible substrate may include a polymer, or fiber glass reinforced plastic glass (FRP). Examples of the polymer may include polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. However, the material of the first substrate SUB1 is not limited the foregoing materials.

The polarizing layer POL may be arranged on the first substrate SUB1 and polarize light generated from the organic light emitting layer OLED in a predetermined direction.

The organic light emitting layer OLED may be arranged on the polarizing layer POL and generate light. As will be discussed in detail below, the organic light emitting layer OLED may include two electrodes and an emitting layer arranged between the two electrodes. The emitting layer may react to electrons and holes injected through the two electrodes to generate light in a predetermined wavelength range.

The second substrate SUB2 may include substantially the same material as the first substrate SUB1. However, SUB2 may include different materials and in various exemplary embodiments, the second substrate SUB2 may be a metal substrate to ensure flexibility. For example, the metal substrate may include, but is not limited to, at least one of iron steel, carbon steel, stainless steel, cast iron, steel casting, and nickel steel (Invar). The pixel circuit PC may be arranged on the second substrate SUB2 and include a plurality of pixel areas in which display devices (not illustrated) for displaying images are provided. Each of the plurality of pixel areas may include at least one pixel to provide an image. The nature of the pixel is not particularly limited as long as it can display an image. Various display devices, such as an organic light emitting device, a liquid crystal display, an electrowetting device, and an electrophoretic device, may be used in connection with the subject matter described herein.

The conductive adhesive CA may be arranged between the first substrate SUB1 and the second substrate SUB2. More specifically, one side of the conductive adhesive CA may be connected to the organic light emitting layer OLED and the other side of the conductive adhesive CA may be connected to the pixel circuit PC. As a result, the organic light emitting layer OLED and the pixel circuit PC may be electrically connected to each other through the conductive adhesive CA.

The conductive adhesive CA may include an organic polymer and nano-sized conductive particles provided in the organic polymer. In some embodiments, the conductive particles in the conductive adhesive may make the conductive adhesive opaque.

In the display device according to various exemplary embodiments, since the pixel circuit PC and the organic light emitting layer OLED are electrically connected through the conductive adhesive CA, the first substrate SUB1 and the second substrate SUB2 may be bonded to each other without using an optically clear adhesive.

Therefore, the display device according to various exemplary embodiments may be thinner by firmly connecting the first substrate SUB1 and the second substrate SUB2 to each other without using an optically clear adhesive therebetween, which adds to the thickness of the device.

Hereinafter, display devices according to various exemplary embodiments of the invention are described in detail with examples.

Figure 2:
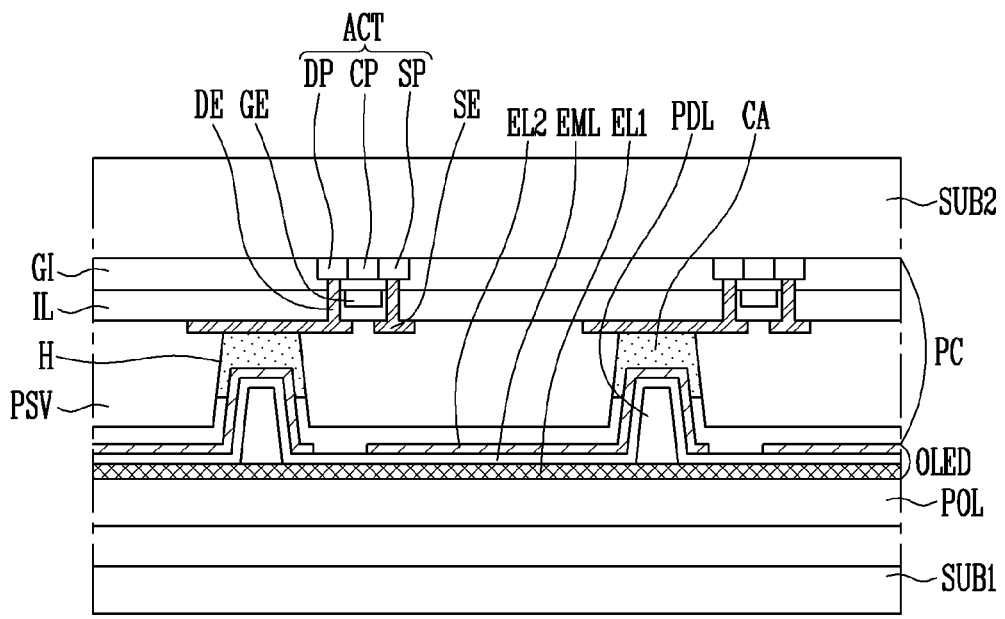
FIG. 2 is a partial cross-sectional view illustrating a display device constructed according to a first exemplary embodiment of the invention.

Referring to FIG. 2, the display device according to the first exemplary embodiment may include a first substrate SUB1 and a second substrate SUB2 opposing each other. In addition, the display device according to the first exemplary embodiment may include a polarizing layer POL, an organic light emitting layer OLED, and a pixel circuit PC which are arranged between the two substrates SUB1 and SUB2.

The first substrate SUB1 may support various components that are formed on the first substrate SUB1. The first substrate SUB1 may include an insulating material. For example, the first substrate SUB1 may include, but is not limited to, a rigid substrate or a flexible substrate. The first substrate SUB1 may include various materials.

The second substrate SUB2 may, or might not, include substantially the same material as the first substrate SUB1. In addition, the second substrate SUB2 may include a metal substrate to ensure flexibility. For example, the material of embodiments with the metal substrate may include, but is not limited to nickel steel (Invar).

The polarizing layer POL may be disposed on the first substrate SUB1 and polarize light generated from the organic light emitting layer OLED in a predetermined direction.

The organic light emitting layer OLED may be disposed on the polarizing layer POL and include two electrodes EL1 and EL2 and an emitting layer EML disposed between the two electrodes EL1 and EL2.

The pixel circuit PC may be disposed on the second substrate SUB2 and include a plurality of pixel areas each including at least one thin film transistor. In addition, the pixel circuit PC may further include a conductive adhesive CA electrically connected to one or more of the thin film transistors.

Hereinafter, the display device according to the first exemplary embodiment is described according to an exemplary stacking order. For convenience of explanation, the first substrate SUB1 is described first, and the second substrate SUB2 is then described.

The first substrate SUB1 may be provided.

Though not illustrated, a first buffer layer may be disposed on the first substrate SUB1. The first buffer layer may prevent diffusion of impurities into the organic light emitting layer OLED. The first buffer layer may be omitted depending on the material of the first substrate SUB1 and process conditions.

The polarizing layer POL may be disposed on the first substrate SUB1. The polarizing layer POL may minimize loss of light generated from the organic light emitting layer OLED and absorb externally incident light to further enhance visualization of an image. In addition, the polarizing layer POL may polarize light generated from the organic light emitting layer OLED in a predetermined direction.

According to various exemplary embodiments, the polarizing layer POL may include a linear polarization layer and a phase delay layer formed by dyeing a polyvinyl alcohol (PVA)-based resin film by absorption of a dichroic dye and performing uniaxially stretching of the dyed resin film to orient the dichroic dye. In addition, the polarizing layer POL may include a cellulose acetate-based polarization protection film stacked on one or both surfaces thereof. As the dichroic dye, anthraquinone, azo colorants, or iodine may be used. However, the polarizing layer POL is not limited thereto and may include various configurations such as a wire grid polarizer.

The first electrode EL1 may be disposed on the polarizing layer POL. The first electrode EL1 may function as an anode and have a plate shape. The first electrode EL1 may be provided to inject holes and include a material having a high work function. For example, as shown in FIG. 2, when an image is provided toward a lower portion of the first substrate SUB1, the first electrode EL1 may include a transparent conductive material such as an indium tin oxide (ITO), an indium zinc oxide (IZO), a zinc oxide (ZnO), and/or an indium tin zinc oxide (ITZO).

A pixel defining layer PDL dividing each of the plurality of pixel areas may be provided on the first electrode EL1. The pixel defining layer PDL may be disposed along the circumference of the first electrode EL1 (if it is provided with a circular shape) and include an opening through which the first electrode EL1 is externally exposed. The pixel defining layer PDL may include a protrusion protruding toward the second substrate SUB2.

The emitting layer EML may be disposed over the first electrode EL1 and the pixel defining layer PDL. The emitting layer EML may include an organic light emitting material displaying light of a color such as red, green or blue, or of white light. In various exemplary embodiments, the emitting layer EML is a single layer. However, in various exemplary embodiments, the emitting layer EML may include a multilayer film.

The second electrode EL2 may be disposed on the emitting layer EML. The second electrode EL2 may function as a cathode and include a conductive material having a lower work function than the first electrode EL1. For example, the second electrode EL2 may include a conductive material such as Ag, Mg, Al, Pt, Pd, Au, Ni, Nd, Ir, Cr, Li, or Ca. The conductive material may include an opaque layer, or a transparent layer having a predetermined thickness or less. The second electrode EL2 may be patterned and provided to each of the plurality of pixel areas. In addition, the second electrode EL2 may be provided to the outermost edge of the first substrate SUB1 and be electrically connected to the pixel circuit PC.

When an image is provided toward the lower portion of the first substrate SUB1, the second electrode EL2 may include an opaque conductive material to reflect light generated from the emitting layer EML in a direction of the first substrate SUB1. In this example, the second electrode EL2 may include a metal layer having a predetermined thickness or more so as to facilitate movements of electrons toward the emitting layer EML. According to various exemplary embodiments, the metal layer may include aluminum (Al).

Subsequently, the second substrate SUB2 is described according to an exemplary stacking order.

The second substrate SUB2 may be provided. The second substrate SUB2 may include substantially the same material as the first substrate SUB1 or it could include other materials. The second substrate SUB2 may be a metal substrate to ensure flexibility.

Though not illustrated, a second buffer layer may be disposed on the second substrate SUB2. The second buffer layer may block diffusion of impurities into the pixel circuit PC provided on the second substrate SUB2.

An active pattern ACT may be disposed on the second substrate SUB2. The active pattern ACT may include a semiconductor material. The active pattern ACT may include a source portion SP, a drain portion DP, and a channel portion CP disposed between the source portion SP and the drain portion DP. The active pattern ACT may be a semiconductor pattern including doped or undoped silicon, for example, doped or undoped polysilicon, doped or undoped amorphous silicon, or an oxide semiconductor.

According to various exemplary embodiments, the active pattern ACT may be an oxide semiconductor. The oxide semiconductor may include a metal oxide. Examples of the metal oxide may include gallium (Ga), indium (In), tin (Sn), and zinc (Zn). The metal oxide may further include lithium (Li), beryllium (Be), natrium (Na), magnesium (Mg), calcium (Ca), scandium (Sc), titanium (Ti), vanadium (V), manganese (Mn), iron (Fe), nickel (Ni), copper (Cu), yttrium (Y), zirconium (Zr), niobium (Nb), ruthenium (Ru), palladium (Pd), cadmium (Cd), tantalum (Ta), tungsten (W), boron (B), carbon (C), nitrogen (N), fluorine (F), aluminum (Al), silicon (Si), phosphorus (P), and germanium (Ge). More specifically, the active pattern ACT may include a single oxide such as a gallium oxide, an indium oxide, a tin oxide, and a zinc oxide, or a mixed metal oxide such as a gallium indium zinc oxide (Ga2O3-In2O3-ZnO: GIZO), an indium gallium tin oxide (In2O3-Ga2O3-SnO), an indium zinc oxide (In2O3-Zn2O3), and a zinc aluminum oxide ($Zn_2O_3$—$Al_2O_3$).

When the active pattern ACT is a semiconductor pattern including one of the above-described oxide semiconductors, electrical characteristics of the thin film transistor including the active pattern ACT may be improved. Therefore, it may be easier to manufacture the display device with high resolution and large size.

A gate insulating layer GI may be disposed on the active pattern ACT.

A gate electrode GE may be disposed on the gate insulating layer GI. The gate electrode GE may cover a region corresponding to the channel portion CP of the active pattern ACT.

An interlayer insulating layer IL may be disposed on the gate electrode GE to cover the gate electrode GE.

A source electrode SE and a drain electrode DE may be disposed on the interlayer insulating layer IL. The source electrode SE and the drain electrode DE may contact the source portion SP and the drain portion DP, respectively, through an opening formed in the gate insulating layer GI and the interlayer insulating layer IL. Thus, the source electrode SE and the drain electrode pass all the way through the gate insulating layer GI and the interlayer insulating layer IL to reach the source portion SP and the drain portion DP, respectively, in the cross-sectional view of FIG. 2.

The active pattern ACT, the gate electrode GE, the source electrode SE and the drain electrode DE may form the thin film transistor. However, the configuration of the thin film transistor is not necessarily limited thereto and the thin film transistor may have various configurations. For example, the thin film transistor may have a top gate structure. However, the thin film transistor may also have a bottom gate structure such that the gate electrode GE may be arranged under the active pattern ACT. Nevertheless, for ease of description, various exemplary embodiments herein will be described in connection with the thin film transistor including the active pattern ACT. But, it should be understood that in various exemplary embodiments the thin film transistor may have a variety of other structures as apparent to the skilled artisan.

A passivation film PSV may be disposed on the source electrode SE and the drain electrode DE. The passivation film PSV may cover the thin film transistor including the active pattern ACT and include at least one layer. In addition, the passivation film PSV may planarize the surface of the lower structure by relieving irregularities thereof. The passivation film PSV may include a contact hole H through which a portion of the drain electrode DE is externally exposed. The contact hole H may be formed in the passivation film PSV at a position corresponding to the pixel defining layer PDL.

As illustrated in FIG. 2, since the pixel defining layer PDL protrudes, the pixel defining layer PDL may be inserted into the contact hole H of the passivation film PSV. As illustrated in FIG. 2, the contact hole H may have a trapezoidal shape. However, in other exemplary embodiments, the contact hole H may have various other shapes such that the pixel defining layer PDL may be inserted into the contact hole H.

The conductive adhesive CA may be provided in the contact hole H of the passivation film PSV. The conductive adhesive CA may be an anisotropic conductive film (ACF). In addition, the conductive adhesive CA may include an organic polymer and nano-sized conductive particles provided in the organic polymer. The conductive adhesive CA may be placed in the contact hole H in any number of ways, including by printing or by using a nozzle.

The conductive adhesive CA may thus be placed in the contact hole H. One side thereof may be connected to the drain electrode DE of the thin film transistor including the active pattern ACT and the other side thereof may be connected to the second electrode EL2. As a result, the organic light emitting layer OLED of the first substrate SUB1 and the pixel circuit PC of the second substrate SUB2 may be electrically connected to each other through the conductive adhesive CA. In other words, the second electrode EL2 of the organic light emitting layer OLED may receive a driving signal from the thin film transistor including the active pattern ACT of the pixel circuit PC through the conductive adhesive CA.

As described above, the first substrate SUB1 on which the organic light emitting layer OLED is formed and the second substrate SUB2 on which the pixel circuit PC is formed may be electrically connected to each other through the conductive adhesive CA and also physically firmly bonded to each other by the conductive adhesive CA.

As a result, the display device according to the first exemplary embodiment may be thinner by bonding the two substrates SUB1 and SUB2 to each other without using an optically clear adhesive (OCA) to bond the two substrates SUB1 and SUB2 to each other.

In addition, since the display device according to the first exemplary embodiment improves the electrical characteristics of the thin film transistor including the active pattern ACT through the use of the conductive adhesive CA, high resolution and a large size of the display device may be easily achieved.

Figure 3:
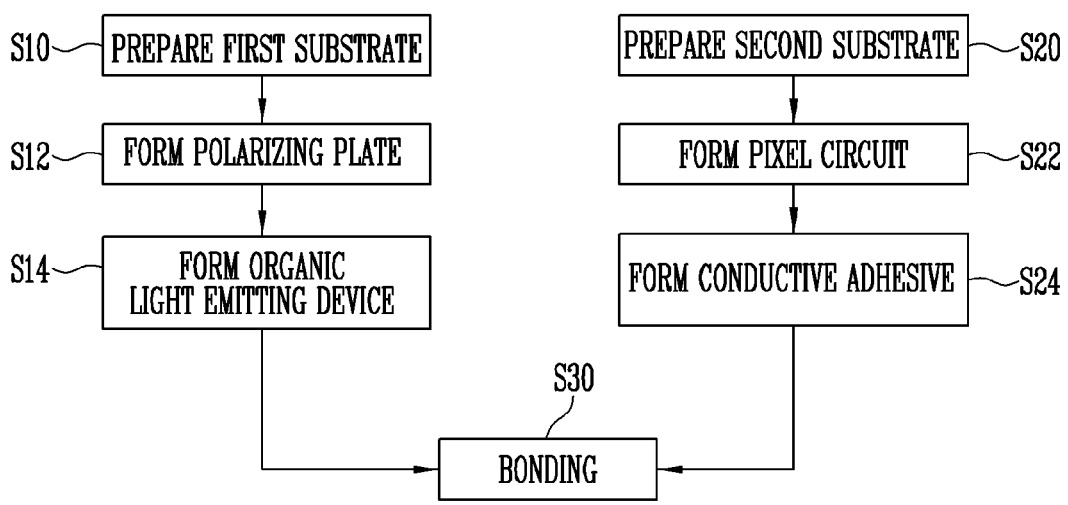
FIG. 3 is a flowchart illustrating an exemplary method of fabricating the display device shown in FIG. 2.

Referring to FIGS. 2 and 3, the first substrate SUB1 may be prepared (S10). The polarizing layer POL may then be formed on the first substrate SUB1 (S12). The organic light emitting layer OLED may thereafter be formed on the polarizing layer POL (S14).

Subsequently, or in a parallel process as illustrated, the second substrate SUB2 may be prepared (S20). The pixel circuit PC may then be formed on the second substrate SUB2 (S22). The conductive adhesive CA may thereafter be formed on the pixel circuit PC (S24).

Subsequently, the first substrate SUB1 may be positioned above the second substrate SUB2 and the first substrate SUB1 and the second substrate SUB2 may be bonded to each other (S30).

Through the above steps S10 to S30, the display device according to the first exemplary embodiment may be fabricated. This will be described in more detail with reference to FIGS. 4 to 8.

Figure 4:
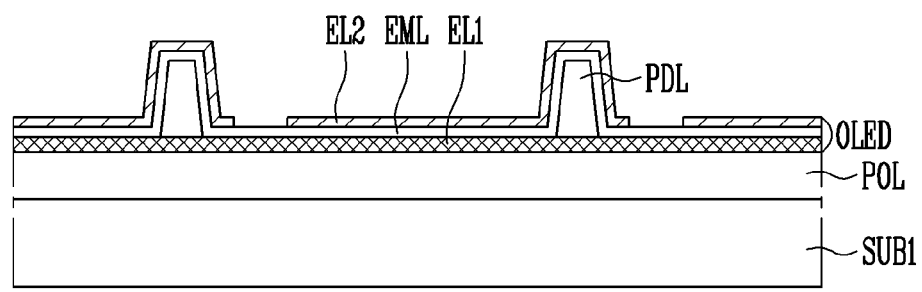
FIGS. 4 to 8 are partial cross-sectional views sequentially illustrating the exemplary method of fabricating the display device as shown in FIG. 3.

Referring to FIG. 4, the polarizing layer POL may be formed on the first substrate SUB1. Subsequently, the organic light emitting layer OLED may be formed on the polarizing layer POL. The pixel defining layer PDL of the organic light emitting layer OLED may be patterned so as to divide the plurality of pixel areas, and include a protrusion protruding upwards. In addition, the second electrode EL2 of the organic light emitting layer OLED may be patterned to correspond to each of the plurality of pixel areas.

Figure 5:
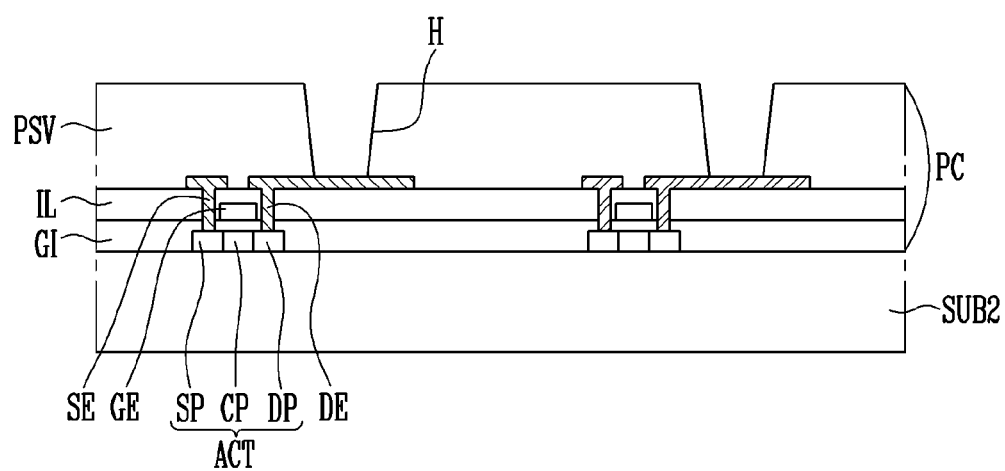

Referring to FIG. 5, a thin film transistor and the passivation film PSV covering the thin film transistor including the active pattern ACT may be formed on the second substrate SUB2. The passivation film PSV may include the contact hole H through which a portion of the drain electrode DE of the thin film transistor including the active pattern ACT is externally exposed. The contact hole H may be located at a position corresponding to the pixel defining layer PDL and have a size so that the pixel defining layer PDL may be inserted into the contact hole H.

When the contact hole H is formed, in order to remove a residual layer of the passivation film PSV which may remain in the contact hole H, an ashing process using plasma may be performed. During the ashing process using plasma, the externally exposed portion of the drain electrode DE may be etched by plasma to perform surface treatment thereon. In this example, electrical characteristics of the drain electrode DE may be improved.

Figure 6:
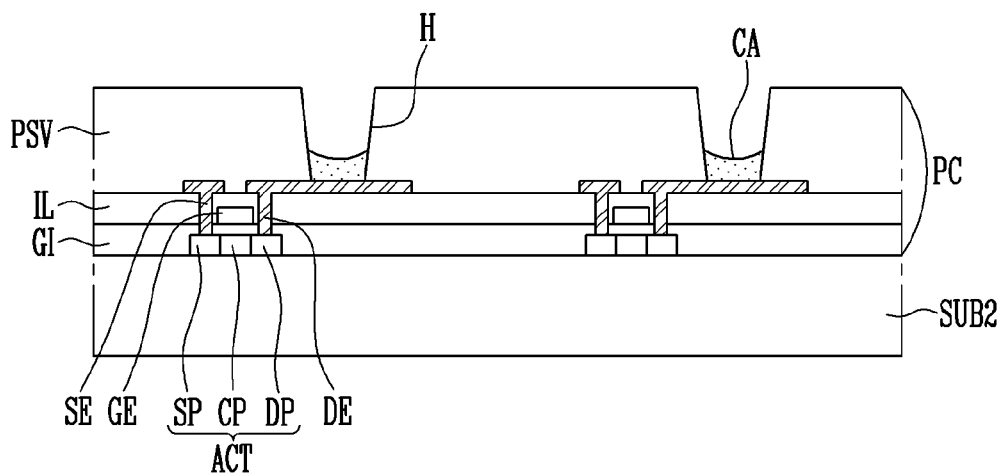

Referring to FIG. 6, the conductive adhesive CA may be formed in the contact hole H. The conductive adhesive CA may be an anisotropic conductive film (ACF) including an organic polymer and nano-sized conductive particles provided in the organic polymer. The conductive adhesive CA may be liquid and provided in the contact hole H by printing or by using a nozzle.

The conductive adhesive CA may be formed in the contact hole H and one side thereof (the bottom, for example, in FIG. 7) may contact the drain electrode DE.

Figure 7:
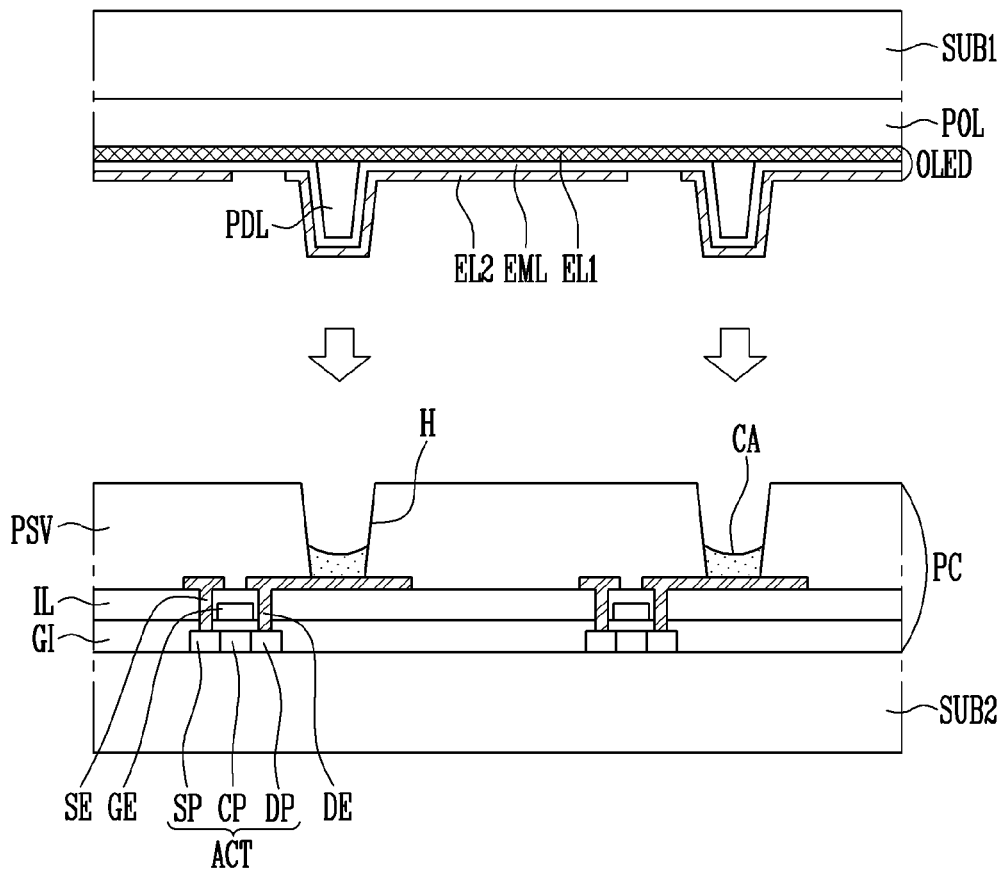

Referring to FIG. 7, the first substrate SUB1 may be loaded and arranged above the second substrate SUB2. The first substrate SUB1 may be arranged such that the pixel defining layer PDL of the first substrate SUB1 may correspond to the contact hole H of the second substrate SUB2.

Figure 8:
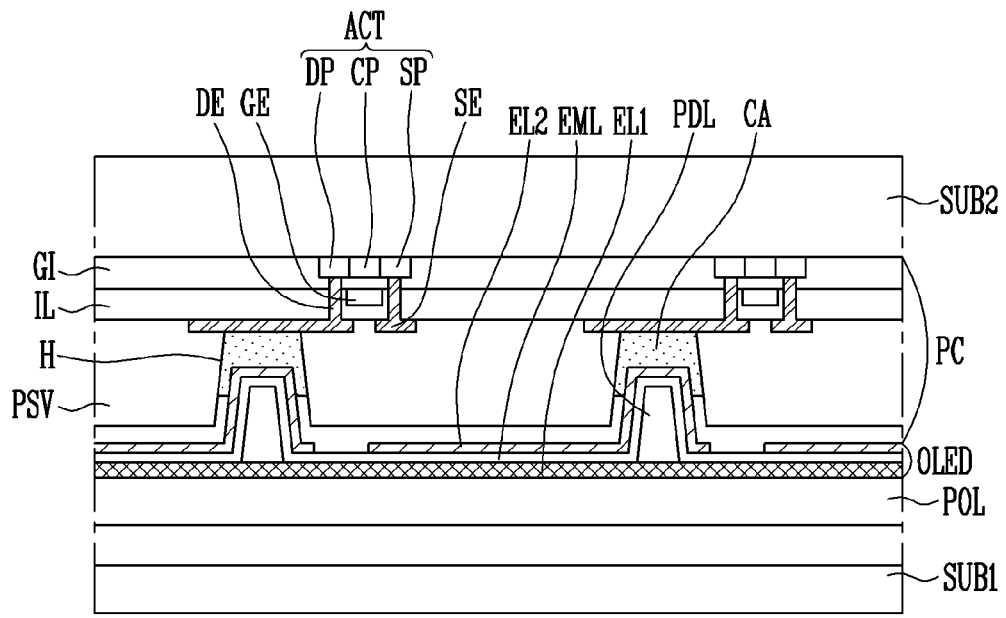

Subsequently, by pressing together the first substrate SUB1 and the second substrate SUB2, the first and second substrates SUB1 and SUB2 may be bonded to each other by way of the adhesive properties of the conductive adhesive CA as shown in FIG. 8. When the first substrate SUB1 and the second substrate SUB2 are bonded to each other, the pixel defining layer PDL of the first substrate SUB1 may be inserted into the contact hole H of the second substrate SUB2, so that the other side of the conductive adhesive CA may contact the second electrode EL2 of the first substrate SUB1. When the pixel defining layer PDL is inserted into the contact hole H, the conductive adhesive CA may be pressed by the pixel defining layer PDL and move along a sidewall of the passivation film PSV including the contact hole H such that the conductive adhesive contacts sidewalls of the second electrode EL2 of the first substrate SUB1.

As a result, the first substrate SUB1 and the second substrate SUB2 may be both electrically connected and physically bonded to each other by the conductive adhesive CA while eliminating the need for an optically clear adhesive (OCA).

Figure 9:
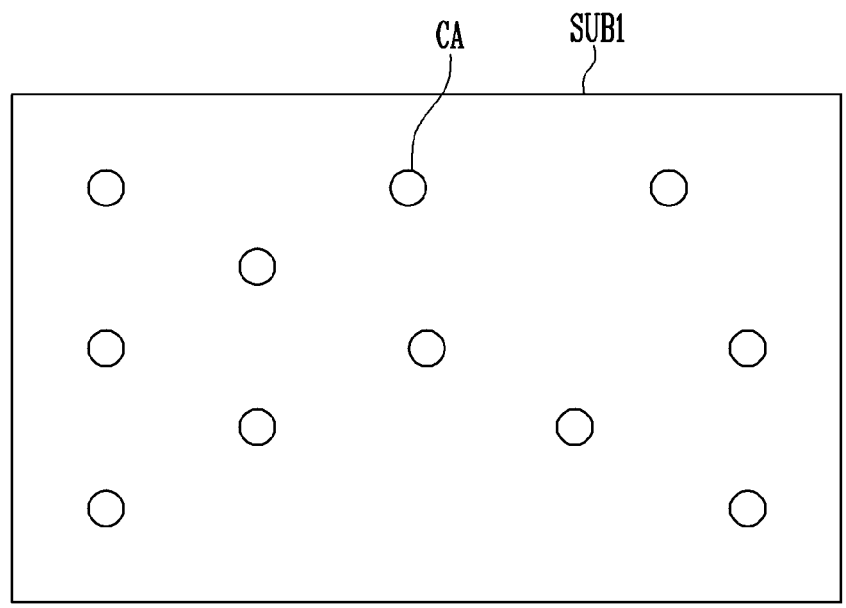
FIG. 9 is a schematic plan view illustrating an exemplary embodiment of a conductive adhesive disposed over the first substrate of the exemplary embodiment shown in FIG. 2.

Referring to FIGS. 2 and 9, the conductive adhesive CA may be provided at each of the plurality of pixel areas of the first substrate SUB1. FIG. 9 depicts an exemplary embodiment with eleven pixel areas, but, of course, other numbers of pixel areas may be used. For example, the conductive adhesive CA may be provided to a predetermined sub-set of pixel areas, such as pixel areas where light of a predetermined color is emitted, or pixel areas in a u) predetermined region or portion of the display. In other words, the conductive adhesive CA may be regularly, by a variety of different metrics, or randomly arranged on a display area of the display device.

In addition, the conductive adhesive CA may be irregularly or randomly arranged in a non-display area surrounding the display area.

When the conductive adhesive CA is applied to a flexible display device which is designed to be bent, the conductive adhesive CA may be differently arranged between a bent portion and a non-bent portion, i.e., a rigid portion. As a result, the density of the conductive adhesive CA may differ in the bent portion versus the rigid portion. For example, in a bent portion, certain portions of the conductive adhesive may be compressed to have a higher density and/or expanded to have a lower density to facilitate bending.

For convenience of explanation, a touch sensing portion is omitted in connection with describing the above-described display device according to the first exemplary embodiment. However, the display device according to the first exemplary embodiment may include the touch sensing portion. Other display devices according to other exemplary embodiments will be described below on the assumption that they include the touch sensing portion as one of the components.

Figure 10:
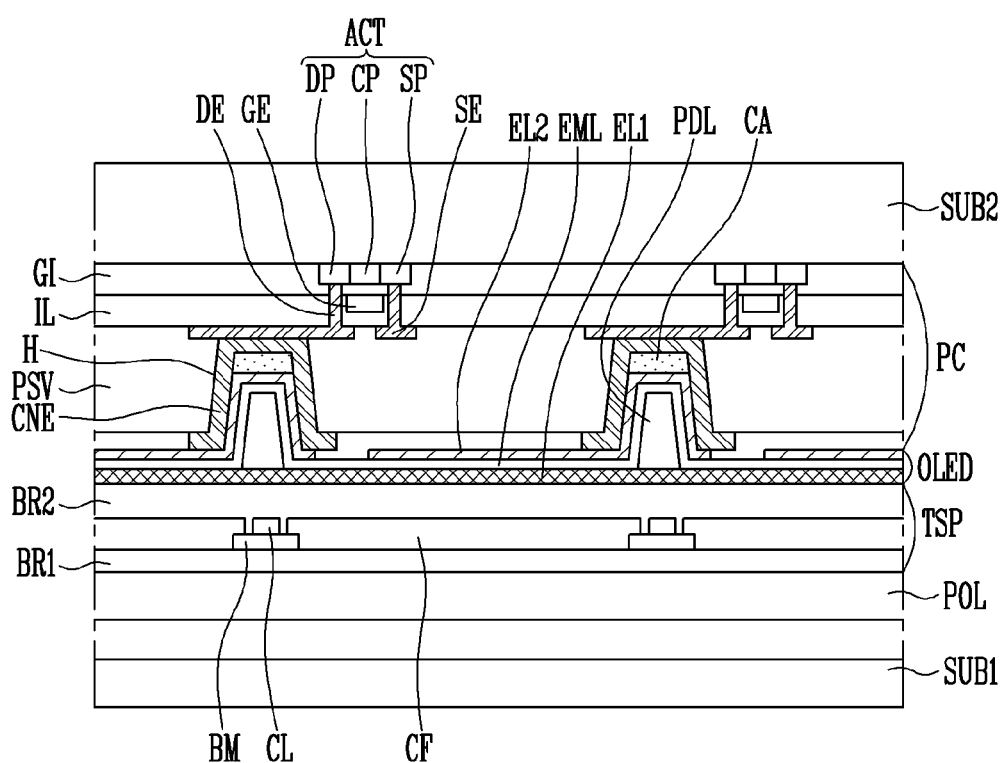
FIG. 10 is a partial cross-sectional view illustrating a display device according to a second exemplary embodiment of the invention.

Referring to FIG. 10, to avoid duplication of description, some of the similarities between the display device according to the second exemplary embodiment and the display device according to the above-described first exemplary embodiment will not be described. Portions of the second exemplary embodiment which are not particularly described below coincide with corresponding portions of the display device according to the above-described exemplary embodiment. The same reference numerals refer to the same components and similar reference numerals refer to similar components.

The display device according to the second exemplary embodiment may include the first substrate SUB1 and the second substrate SUB2 opposing each other. In addition, the display device according to the second exemplary embodiment may include the polarizing layer POL, a touch sensing portion TSP, the organic light emitting layer OLED, and the pixel circuit PC that are disposed between the first substrate SUB1 and the second substrate SUB2.

The first substrate SUB1 may include the polarizing layer POL, the touch sensing portion TSP, and the organic light emitting layer OLED that are sequentially formed thereon.

The touch sensing portion TSP may be arranged on the polarizing layer POL and sense a touch event on the display device by a user's hand or receive a separate input. The touch sensing portion TSP may include sensing electrodes and thereby sense touch and/or pressure. The touch sensing portion TSP may be classified according to various types, such as a capacitive type, a resistive type, an electromagnetic type, a piezoresistive type, and an optical type. Other types of touch sensors may also be used. Embodiments with the capacitive type of touch sensing portion may include, for example, a mutual capacitance type in which changes in capacitance caused by interactions between two sensing electrodes are sensed or a self-capacitance type in which changes in capacitance of the sensing electrodes themselves are sensed. The touch sensing portion TSP may include a first barrier layer BR1, a color filter CF, a black matrix BM, a connection line CL, and a second barrier layer BR2.

The organic light emitting layer OLED may include the first electrode EL1, the second electrode EL2, and the emitting layer EML arranged between the two electrodes EL1 and EL2.

The second substrate SUB2 may include the pixel circuit PC. The pixel circuit PC may include a plurality of pixel areas each including at least one thin film transistor.

Hereinafter, the display device according to the second exemplary embodiment is described according to an exemplary stacking order. For convenience of explanation, the first substrate SUB1 is described first and the second substrate SUB2 is then the described.

The first substrate SUB1 may be provided. The first substrate SUB1 may be a rigid substrate or a flexible substrate.

The polarizing layer POL may be disposed on the first substrate SUB1.

The first barrier layer BR1 may be disposed on the polarizing layer POL. The first barrier layer BR1 may block intrusion of oxygen and moisture into the polarizing layer POL and the first substrate SUB1. The first barrier layer BR1 may be in the form of a film in which an organic material is coated with a single-layer or a multilayer inorganic material. However, other materials and layer structures may be used as well The color filter CF and the black matrix BM may be disposed on the first barrier layer BR1. The color filter CF may impart color to light which transmits through the plurality of pixel areas.

A connection line CL may be disposed on the black matrix BM. The connection line CL may electrically connect sensing electrodes (not illustrated) for sensing a user's touch and/or a touch input to a driving circuit (not illustrated). The connection line CL may transfer a sensing input signal from the driving circuit to the sensing electrodes, or transfer a sensing output signal from the sensing electrodes to the driving circuit. The connection line CL may be directly arranged on the black matrix BM and overlap with the black matrix BM in order that the connection line CL may be prevented from being viewable in externally incident light that is reflected by the display. Various exemplary embodiments of a touch sensor including the connection line CL and the sensing electrodes are described below.

The second barrier layer BR2 may be disposed on the connection line CL. The second barrier layer BR2 may planarize portions of the lower structures (CF, BM, and CL). In addition, the second barrier layer BR2 may block intrusion of oxygen and moisture into structures such as CF, BM, and CL. The second barrier layer BR2 may include substantially the same material as the first barrier layer BR1, but is not limited thereto.

The first electrode EL1 may be disposed on the second barrier layer BR2. The first electrode EL1 may function as an anode and have a plate shape. The first electrode EL1 may be provided to inject holes into the conductive structure and include a material having a high work function.

The pixel defining layer PDL may be disposed on the first electrode EL1 and divide each of the plurality of pixel areas one from another. The pixel defining layer PDL may be provided along the circumference of the first electrode EL1 (if it is provided with a circular shape) and include a protrusion protruding toward the second substrate SUB2.

The emitting layer EML may be disposed on the first electrode EL1 and the pixel defining layer PDL.

The second electrode EL2 may be disposed on the emitting layer EML. The second electrode EL2 may function as a cathode, and be patterned and provided to each of the plurality of pixel areas. The second electrode EL2 may include a conductive material having a lower work function than the first electrode EL1. The second electrode EL2 may be provided on the outermost edge of the first substrate SUB1 and electrically connected to the pixel circuit PC.

The second substrate SUB2 is described below according to an exemplary stacking order.

The second substrate SUB2 may be provided.

A thin film transistor including the active pattern ACT, which is the gate electrode GE, and the source and drain electrodes SE and DE, may be disposed on the second substrate SUB2.

The passivation film PSV may be disposed on the thin film transistor including the active pattern ACT. The passivation film PSV may include the contact hole H through which a portion of the drain electrode DE is externally exposed. The contact hole H may be arranged on the passivation film PSV at a position corresponding to the pixel defining layer PDL.

A contact electrode CNE may be disposed on the passivation film PSV. The contact electrode CNE may be arranged in the contact hole H of the passivation film PSV and may be electrically connected to the drain electrode DE of the thin film transistor including the active pattern ACT.

The conductive adhesive CA may be disposed on the contact electrode CNE. The conductive adhesive CA may be an anisotropic conductive film (ACF). The conductive adhesive CA may be liquid and may be provided in the contact hole H by printing or by using a nozzle.

The conductive adhesive CA may be provided in the contact hole H. One side of the conductive adhesive CA may be connected to the thin film transistor including the active pattern ACT through the contact electrode CNE and the other side thereof may be connected to the second electrode EL2. Therefore, the organic light emitting layer OLED of the first substrate SUB1 and the pixel circuit PC of the second substrate SUB2 may be electrically connected to each other through the conductive adhesive CA.

Figure 11:
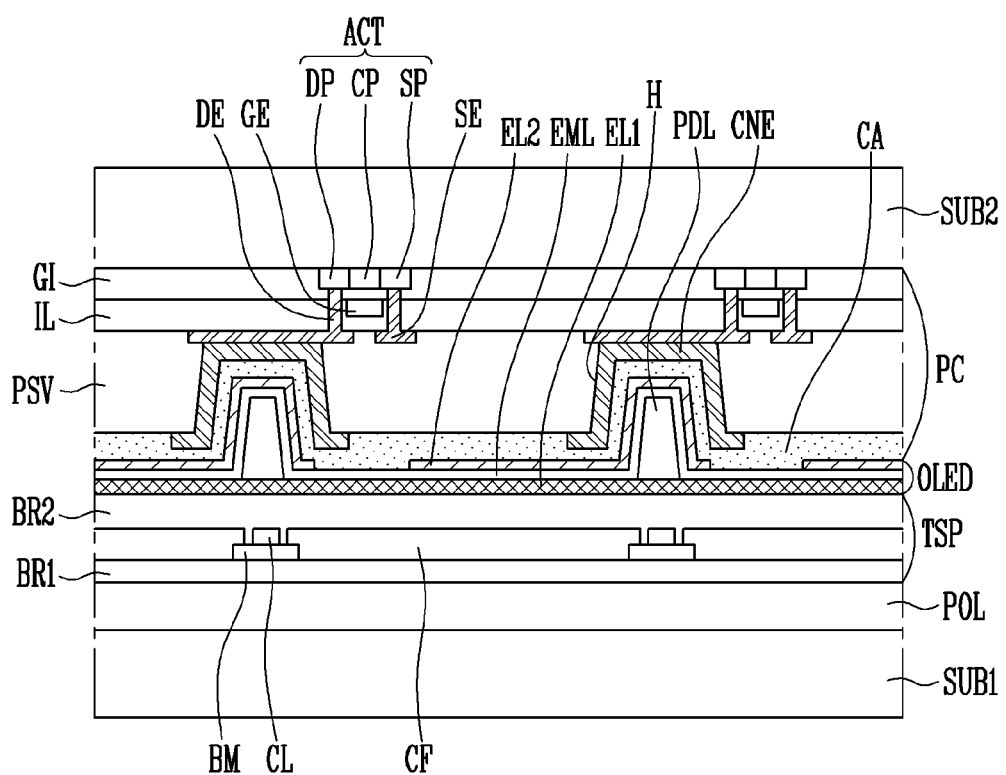
FIG. 11 is a partial cross-sectional view illustrating a display device according to a third exemplary embodiment of the invention.

Referring to FIG. 11, to avoid duplication of description, some of the similarities between the display device according to the third exemplary embodiment and the display devices according to the earlier described exemplary embodiments will not be described. Portions of the third exemplary embodiment which are not particularly described below coincide with corresponding portions of the display devices according to the above-described exemplary embodiments. The same reference numerals refer to the same components and similar reference numerals refer to similar components. The display device according to the third exemplary embodiment may include the first substrate SUB1 and the second substrate SUB2 opposing each other. In addition, the display device according to the third exemplary embodiment may include the polarizing layer POL, the touch sensing portion TSP, the organic light emitting layer OLED, and the pixel circuit PC that are arranged between the first substrate SUB1 and the second substrate SUB2.

The first substrate SUB1 may include the polarizing layer POL, the touch sensing portion TSP, and the organic light emitting layer OLED which may be sequentially formed as described in greater detail elsewhere herein. The touch sensing portion TSP may include the black matrix BM, the color filter CF, sensing electrodes (not illustrated), and the connection line CL. The organic light emitting layer OLED may include the first electrode EL1, the second electrode EL2, and the emitting layer EML arranged between the two electrodes EL1 and EL2.

The second substrate SUB2 may include the pixel circuit PC. The pixel circuit PC may include a plurality of pixel areas including at least one thin film transistor (see active pattern(s) ACT in the Figures) in each of the plurality of pixel areas.

Hereinafter, the display device according to the third exemplary embodiment is described according to an exemplary stacking order. For convenience of explanation, the first substrate SUB1 is described first, and the second substrate SUB2 is then described.

The first substrate SUB1 may be provided. The first substrate SUB1 may be a rigid substrate or a flexible substrate.

The polarizing layer POL may be disposed on the first substrate SUB1.

The touch sensing portion TSP may be disposed on the polarizing layer POL.

The first electrode EL1 may be disposed on the touch sensing portion TSP. The first electrode EL1 may function as an anode, may be provided to inject holes into the electrical conductor, and may include a material having a high work function.

A pixel defining layer PDL dividing the plurality of pixel areas may be disposed on the first electrode EL1. The pixel defining layer PDL may be provided along the circumference of the first electrode EL1 (if it is provided with a circular shape) and may include a protrusion protruding toward the second substrate SUB2.

Figure 12:
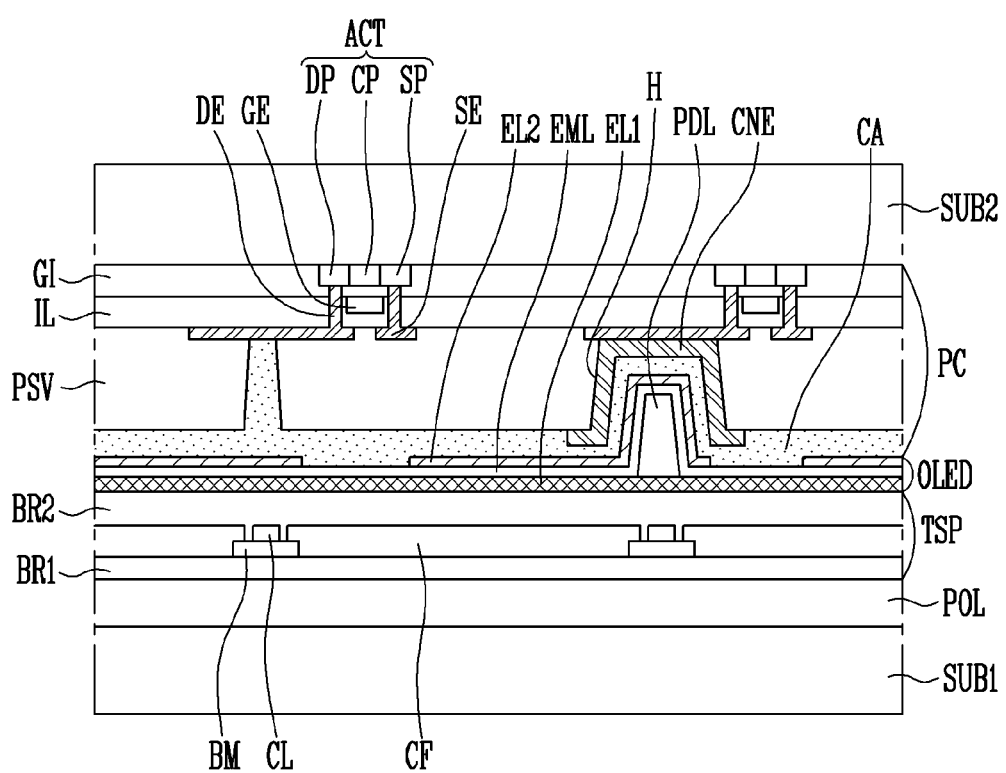
FIG. 12 is a partial cross-sectional view illustrating the position of a pixel defining layer in the display device shown in FIG. 11.

The protrusion may be provided in each of the plurality of pixel areas. For example, as illustrated in FIG. 12, the protrusion may be provided in a predetermined pixel area, a pixel area having light of a predetermined color, for example, red is emitted, or a predetermined region. In other words, the protrusion may be regularly or randomly arranged in a display area of the display device.

In another example, the protrusion may be disposed more in the display area than in a peripheral region surrounding the display area for touch recognition of the touch sensing portion TSP.

The emitting layer EML may be disposed between the first electrode EL1 and the pixel defining layer PDL.

The second electrode EL2 may be disposed on the emitting layer EML. The second electrode EL2 may function as a cathode and be patterned and provided to each of the plurality of pixel areas. When an image is provided toward the lower portion of the first substrate SUB1 in the display device, the second electrode EL2 may include an opaque conductive material.

The second substrate SUB2 is described below according to an exemplary stacking order.

The second substrate SUB2 may be provided. The second substrate SUB2 may include a transparent insulating material. However, other materials may be employed. For example, the second substrate SUB2 may also, or alternatively, include a metal material to ensure flexibility.

A active pattern ACT may be disposed on the second substrate SUB2. According to various exemplary embodiments, the active pattern ACT may be a semiconductor pattern including an oxide semiconductor. Since the active pattern ACT includes an oxide semiconductor, the display device may achieve a higher resolution.

A gate insulating layer GI may be disposed on the active pattern ACT.

A gate electrode GE may be disposed on the gate insulating layer GI. The gate electrode GE may cover a portion of the active pattern ACT at a position corresponding to the channel portion CP.

An interlayer insulating layer IL may be disposed on the gate electrode GE.

A source electrode SE and a drain electrode DE may be disposed on the interlayer insulating layer IL.

A passivation film PSV may be provided over the source electrode SE and the drain electrode DE. The passivation film PSV may include the contact hole H through which a portion of the drain electrode DE is externally exposed. The contact hole H may be formed in the passivation film PSV at a position corresponding to the pixel defining layer PDL.

A contact electrode CNE may be disposed on the passivation film PSV.

A conductive adhesive CA may be disposed on the contact electrode CNE and the passivation film PSV. The conductive adhesive CA may be provided over an entire surface of the second substrate SUB2. The conductive adhesive CA may be an anisotropic conductive film (ACF) including an organic polymer and nano-sized conductive particles provided in the organic polymer. The nano-sized conductive particles may have anisotropy and electrically connect the contact electrode CNE and the second electrode EL2 to each other at a region where the first substrate SUB1 and the second substrate SUB2 are spaced apart from each other at a small distance, i.e., between the contact electrode CNE and the second electrode EL2. The organic polymer may serve as an adhesive which bonds the first substrate SUB1 to the second substrate SUB2.

Since the conductive adhesive CA is disposed over the entire surface of the second substrate SUB2, the conductive adhesive CA may also be disposed in the contact hole H. Therefore, one side of the conductive adhesive CA may be connected to the contact electrode CNE and the other side thereof may be connected to the second electrode EL2.

As described above, the first substrate SUB1 and the second substrate SUB2 may be electrically connected to each other through the conductive adhesive CA and also thereby physically firmly bonded to each other.

Figure 13:
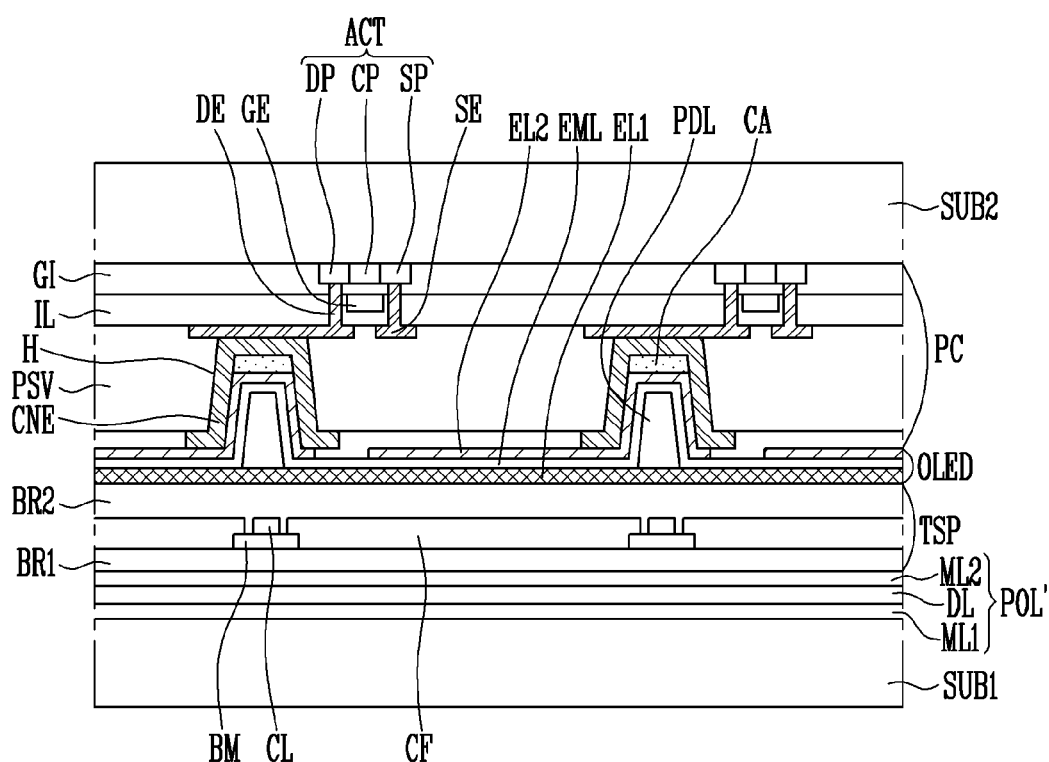
FIG. 13 is a partial cross-sectional view illustrating a display device according to a fourth exemplary embodiment of the invention.

Referring to FIG. 13, to avoid duplication of description, some of the similarities between the display device according to the fourth exemplary embodiment and the display devices according to the earlier described exemplary embodiments will not be described. Portions of the fourth exemplary embodiment which are not particularly described below coincide with corresponding portions of the display devices according to the above-described exemplary embodiments. The same reference numerals refer to the same components and similar reference numerals refer to similar components. The display device according to the fourth exemplary embodiment may include the first substrate SUB1 and the second substrate SUB2 opposing each other. In addition, the display device according to the fourth exemplary embodiment may include a polarizing layer POL' arranged between the first substrate SUB1 and the second substrate SUB2, the touch sensing portion TSP, the organic light emitting layer OLED, and the pixel circuit PC.

The first substrate SUB1 may include the polarizing layer POL', the touch sensor TSP, and the organic light emitting layer OLED, and in various exemplary embodiments, these layers are sequentially formed. The touch sensor TSP may include the black matrix BM, the color filter CF, sensing electrodes (not illustrated), and the connection line CL. The organic light emitting layer OLED may include the first electrode EL1, the pixel defining layer PDL, the emitting layer EML, and the second electrode EL2.

The polarizing layer POL' may include a first metal layer ML1, a dielectric layer DL, and a second metal layer ML2 that are sequentially stacked over the first substrate SUB1. The first metal layer ML1 may be set to have lower absorbance than the second metal layer ML2 so that the first metal layer ML1 and the second metal layer ML2 may function as a black film. In this manner, the second metal layer ML2 may effectively absorb external light internally reflected from the organic light emitting layer OLED and prevent it from being seen by a user of the display, and the first metal layer ML1 may, at the same time, effectively transmit light generated from the emitting layer EML of the organic light emitting layer OLED so that the transmitted light may be seen by the user of the display.

By considering these characteristics, the first metal layer ML1 may include a metal material having high reflectance and low absorbance, such as aluminum (Al) or silver (Ag). In addition, the second metal layer ML2 may include a metal material having low reflectance and high absorbance, such as chromium (Cr), molybdenum (Mo) or titanium (Ti). The dielectric layer DL may change a phase of external light into the organic light emitting layer OLED to induce destructive interference between portions of the external light reflected by the various layers of the device.

The polarizing layer POL' having the above configuration may be provided on the front surface of the organic light emitting layer OLED to prevent external light from being reflected from the organic light emitting layer OLED to reduce the bright room contrast ratio (ambient contrast).

In other words, the polarizing layer POL' may function as a black micro-cavity serving as both a microcavity increasing brightness together with the organic light emitting layer OLED and simultaneously function as a black film increasing the ambient contrast.

Light generated from the emitting layer EML of the organic light emitting layer OLED may be resonated by the second electrode EL2 and the first metal layer ML1. Before the light generated from the emitting layer EML is emitted toward the lower portion (front surface) of the first substrate SUB1, the light may be reflected from the second electrode EL2 and the first metal layer ML1. The light may thereby be emitted to the front surface as light with intensity at a predetermined wavelength being enhanced. The first metal layer ML1 may be thin enough for the light to transmit therethrough so that the light emitted from the emitting layer EML may be emitted to the front surface of the organic light emitting layer OLED. The second electrode EL2 may be so thick that the light may not transmit therethrough.

In addition, most of the external light into the organic light emitting layer OLED may be reflected by the first metal layer ML1 and the second metal layer ML2 and offset by destructive interference between the foregoing respective reflections. Further, some of the external light supplied to the second electrode EL2 may be absorbed again by the first metal layer ML1 and disappear. Since little external light is thus reflected by the polarizing layer POL', the ambient contrast may be improved.

The second substrate SUB2 may include the pixel circuit PC. The pixel circuit PC may include a plurality of pixel areas each including at least one thin film transistor. In addition, the pixel circuit PC may include the passivation film PSV covering the thin film transistor including the active pattern ACT.

The passivation film PSV may include the contact hole H through which a portion of the drain electrode DE of the thin film transistor including the active pattern ACT is externally exposed. The contact hole H may be arranged on the passivation film PSV at a position corresponding to the pixel defining layer PDL.

The contact electrode CNE may be disposed on the passivation film PSV.

The conductive adhesive CA may be provided in the contact electrode CNE. The conductive adhesive CA may be an anisotropic conductive film (ACF). In addition, the conductive adhesive CA may include an organic polymer and nano-sized conductive particles provided in the organic polymer. The conductive adhesive CA may be liquid and may be provided in the contact hole H by printing or by using a nozzle.

The conductive adhesive CA may thus be provided in the contact hole H. One side(s) of the conductive adhesive CA may be connected to the contact electrode CNE and the other side thereof may be connected to the second electrode EL2. Therefore, the organic light emitting layer OLED of the first substrate SUB1 and the pixel circuit PC of the second substrate SUB2 may be electrically connected to each other by the conductive adhesive CA.

Figure 14:
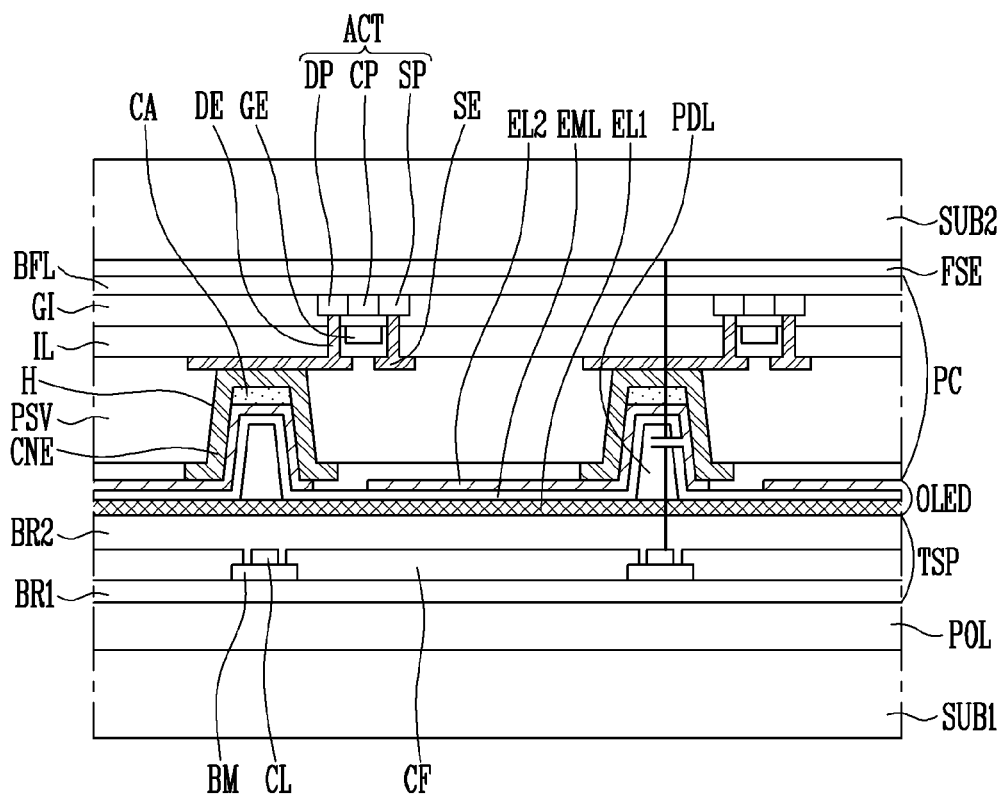
FIG. 14 is a partial cross-sectional view illustrating a display device according to a fifth exemplary embodiment of the invention.

Referring to FIG. 14, to avoid duplication of description, some of the similarities between the display device according to the fifth exemplary embodiment and the display devices according to the earlier described exemplary embodiments will not be described. Portions of the fifth exemplary embodiment which are not particularly described below coincide with corresponding portions of the display devices according to the above-described exemplary embodiments. The same reference numerals refer to the same components and similar reference numerals refer to similar components. The display device according to the fifth exemplary embodiment may include the first substrate SUB1 and the second substrate SUB2 opposing each other. In addition, the display device according to the fifth exemplary embodiment may include the polarizing layer POL, the touch sensor TSP, the organic light emitting layer OLED, the pixel circuit PC, and a pressure sensing electrode FSE that are arranged between the first substrate SUB1 and the second substrate SUB2.

The first substrate SUB1 may include the polarizing layer POL, the touch sensor TSP, and the organic light emitting layer OLED, and, in various exemplary embodiments, these layers are sequentially formed. The touch sensor TSP may include the black matrix BM, the color filter CF, sensing electrodes (not illustrated), and the connection line CL. The organic light emitting layer OLED may include the first electrode EL1, the second electrode EL2, and the emitting layer EML arranged between the two electrodes EL1 and EL2.

The second substrate SUB2 may include the pressure sensing electrode FSE, a buffer layer BFL, and the pixel circuit PC that are, in various exemplary embodiments, sequentially formed.

The pressure sensing electrode FSE may be spaced apart from the touch sensor TSP by a predetermined distance and detect intensity of pressure applied when the user touches the display device. For example, if pressure is exerted when the user touches the surface of the display device according to various exemplary embodiments, the distance between the pressure sensing electrode FSE and the touch sensor TSP may be changed. Therefore, the intensity of the touch pressure may be detected by measuring changes in capacitance according to the changes in distance between the pressure sensing electrode FSE and the touch sensor TSP.

The pressure sensing electrode FSE may be a ground layer of the pixel circuit PC. The pressure sensing electrode FSE may have a plane parallel to a plane of the touch sensor TSP. In addition, the pressure sensing electrode FSE may be formed into a predetermined pattern on the plane parallel to the plane of the touch sensor TSP.

The pressure sensing electrode FSE may be arranged in a peripheral region surrounding a display area of the display device. However, other arrangements are possible.

The second substrate SUB2 may further include a cushion layer (not illustrated) arranged between the pressure sensing electrode FSE and the touch sensor TSP. The cushion layer may have elasticity so that the cushion layer may be compressed by an external pressure and restored into the original state after the external pressure is released. For example, the cushion layer may include a silicone-based elastic adhesive layer or an elastic tape. The pressure sensing electrode FSE, the cushion layer, and the sensing electrodes of the touch sensor TSP may constitute the pressure sensing sensor.

The buffer layer BFL may be disposed on the pressure sensing electrode FSE. The buffer layer BFL may block diffusion of impurities into the pixel circuit PC.

The pixel circuit PC may be disposed on the buffer layer BFL. The pixel circuit PC may include a plurality of pixel areas each including at least one thin film transistor. In addition, the pixel circuit PC may include the passivation film PSV covering the thin film transistor including the active pattern ACT.

The passivation film PSV may include the contact hole H through which a portion of the drain electrode DE of the thin film transistor including the active pattern ACT is externally exposed. The contact hole H may be formed in the passivation film PSV at a position corresponding to the pixel defining layer PDL.

The contact electrode CNE may be disposed on the passivation film PSV.

The conductive adhesive CA may be provided in the contact electrode CNE. The conductive adhesive CA may be an anisotropic conductive film (ACF). In addition, the conductive adhesive CA may include an organic polymer and nano-sized conductive particles provided in the organic polymer. The conductive adhesive CA may be liquid and may be provided in the contact hole H by printing or by using a nozzle.

The conductive adhesive CA may thus be provided in the contact hole H. One or more side(s) thereof may be coupled to the contact electrode CNE and the other side thereof may be coupled to the second electrode EL2. Therefore, the organic light emitting layer OLED of the first substrate SUB1 and the pixel circuit PC of the second substrate SUB2 may be electrically connected to each other by the conductive adhesive CA.

Figure 15:
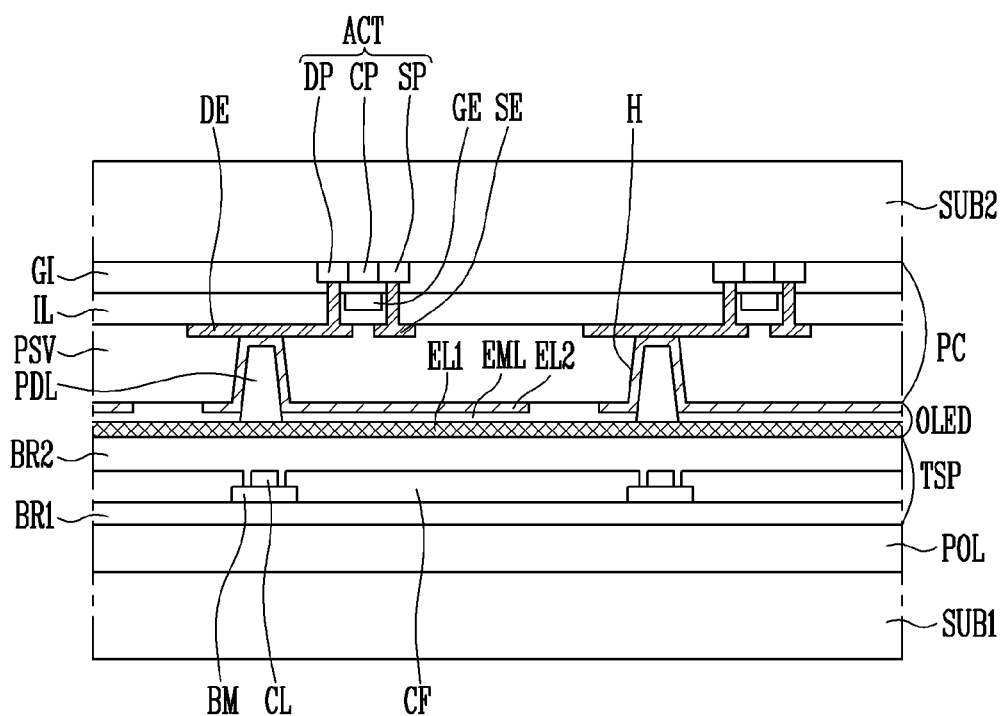
FIG. 15 is a partial cross-sectional view illustrating a display device according to a sixth exemplary embodiment of the invention.

Referring to FIG. 15, to avoid duplication of description, some of the similarities between the display device according to the sixth exemplary embodiment and the display devices according to the earlier exemplary embodiments will not be described. Portions of the sixth exemplary embodiment which are not particularly described below coincide with corresponding portions of the display devices according to the above-described exemplary embodiments. The same reference numerals refer to the same components and similar reference numerals refer to similar components. The display device according to the sixth exemplary embodiment may include the first substrate SUB1 and the second substrate SUB2 opposing each other. In addition, the display device according to the sixth exemplary embodiment may include the polarizing layer POL, the touch sensor TSP, the organic light emitting layer OLED, and the pixel circuit PC that are arranged disposed between the first substrate SUB1 and the second substrate SUB2.

The first substrate SUB1 may include the polarizing layer POL, the touch sensor TSP, and some of the elements of the organic light emitting layer OLED that are, in various exemplary embodiments, sequentially formed. The touch sensor TSP may include the black matrix BM, the color filter CF, sensing electrodes (not illustrated), and the connection line CL. The organic light emitting layer OLED may include the first electrode EL1 and the pixel defining layer PDL dividing each of the plurality of pixel areas.

The second substrate SUB2 may include the pixel circuit PC and the other elements of the organic light emitting layer OLED that are, in various exemplary embodiments, sequentially formed. The pixel circuit PC may include at least one thin film transistor (including the active pattern ACT) included in each of the plurality of pixel areas. The other elements of the organic light emitting layer OLED may include the emitting layer EML and the second electrode EL2 disposed on the emitting layer EML.

The first electrode EL1 may be disposed on the touch sensor TSP formed on the first substrate SUB1. The first electrode EL1 may function as an anode, be provided to inject holes into the electrical conductor, and include a material having a high work function. In addition, the first electrode EL1 may include a transparent conductive material to display an image toward a lower portion of the first substrate SUB1.

The pixel defining layer PDL dividing each of the plurality of pixel areas may be disposed on the first electrode EL1. The pixel defining layer PDL may be provided along the circumference of the first electrode EL1 (if it is provided with a circular shape) and include a protrusion extending toward the second substrate SUB2. The pixel defining layer PDL may include an organic insulating material. For example, the pixel defining layer PDL may include at least one of polystyrene, polymethylmethacrylate (PMMA), polyacrylonitrile (PAN), polyamide (PA), polyimide (PI), polyarylether (PAE), heterocyclic polymer, parylene, epoxy, benzocyclobutene (BCB), siloxane based resin and silane based resin. The pixel defining layer PDL may be cured by a heat treatment process.

The passivation film PSV may be disposed on the second substrate SUB2 on which the at least one thin film transistor (including the active pattern ACT) is formed. The passivation film PSV may include the contact hole H through which a portion of the drain electrode DE of the thin film transistor including the active pattern ACT is externally exposed. The contact hole H may be provided on the passivation film PSV at a position corresponding to the pixel defining layer PDL.

The second electrode EL2 may be disposed on the passivation film PSV. The second electrode EL2 may be patterned and provided to each of the plurality of pixel areas. The second electrode EL2 may include an opaque conductive material having a lower work function than the first electrode EL1.

The emitting layer EML may be disposed between the first electrode EL1 and the second electrode EL2. The emitting layer EML may include an organic light emitting material displaying white light. FIG. 15 illustrates that the emitting layer EML may include a single layer. However, the emitting layer EML may include a multilayer film.

The first substrate SUB1 and the second substrate SUB2 having the above configurations may be bonded to each other by inserting the pixel defining layer PDL into the contact hole H by pressing. More specifically, the first substrate SUB1 may be provided over the second substrate SUB2 such that the pixel defining layer PDL of the first substrate SUB1 may correspond to the contact hole H in the second substrate SUB2. The first substrate SUB1 and the second substrate SUB2 may then be pressed and bonded to each other. Subsequently, the pixel defining layer PDL may be cured by a heat treatment process to fix the first substrate SUB1 and the second substrate SUB2.

Accordingly, the first substrate SUB1 and the second substrate SUB2 may be physically bonded to each other without using an optically clear adhesive (OCA).

Figure 16:
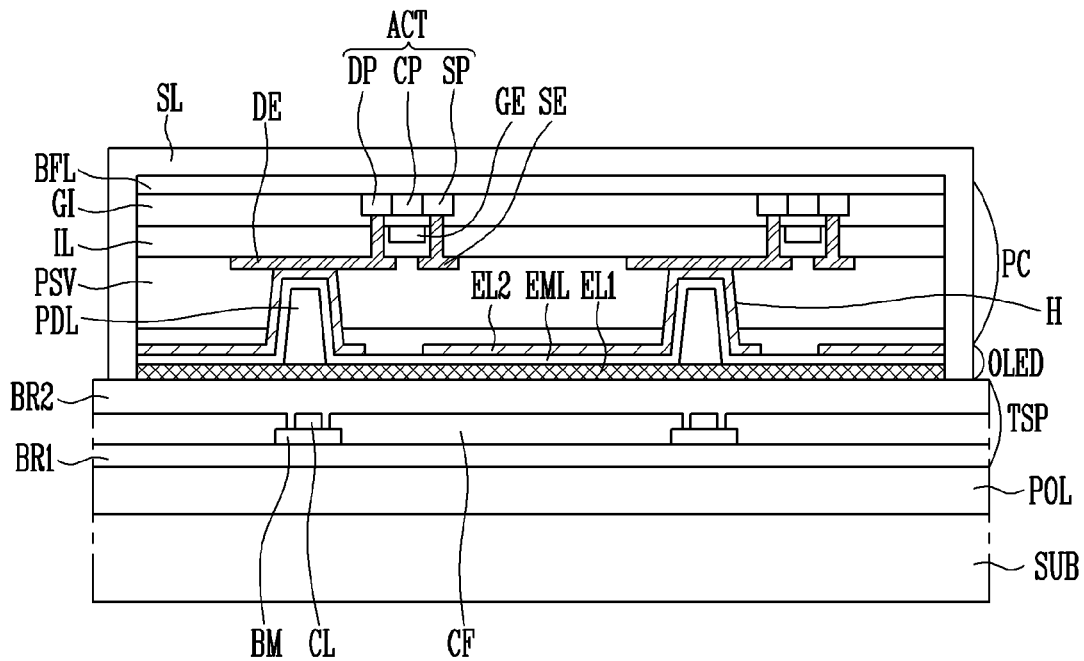
FIG. 16 is a partial cross-sectional view illustrating a display device according to a seventh exemplary embodiment of the invention made by a roll to roll fabrication method.

Referring to FIG. 16, to avoid duplication of description, some of the similarities between the display device according to the seventh exemplary embodiment and the display devices according to the earlier described exemplary embodiments will not be described. Portions of the seventh exemplary embodiment which are not particularly described below coincide with corresponding portions of the display devices according to the above-described exemplary embodiments. The same reference numerals refer to the same components and similar reference numerals refer to similar components. The display device according to the seventh exemplary embodiment may include the polarizing layer POL, the touch sensor TSP, the organic light emitting layer OLED, and the pixel circuit PC that are sequentially formed over the substrate SUB by a roll-to-roll method.

The touch sensor TSP may be in the form of a thin film and disposed on the polarizing layer POL. The touch sensor TSP may include the color filter CF, the black matrix BM, sensing electrodes (not illustrated), and the connection line CL.

The organic light emitting layer OLED may be configured in the form of a thin film and disposed on the touch sensor TSP. The organic light emitting layer OLED may include the first electrode EL1, the second electrode EL2, and the emitting layer EML arranged between the two electrodes EL1 and EL2.

The pixel circuit PC may include a plurality of pixel areas each including at least one thin film transistor.

The display device according to the seventh exemplary embodiment is described according to an exemplary stacking order.

The substrate SUB may be provided. The substrate SUB may include a material transmitting light such as a transparent insulating material. According to various exemplary embodiments, the substrate SUB may include a transparent polyimide (PI) film. However, other arrangements are possible For example, the substrate SUB may include sapphire glass.

Though not illustrated, a light shielding pattern may be disposed on the substrate SUB. The light shielding pattern may prevent structures provided above the substrate SUB from being viewed in reflections of external light when an image is visible in a reflection toward the lower portion of the substrate SUB. The light shielding pattern may be formed on the substrate SUB by printing.

The polarizing layer POL may be provided over the substrate SUB. The polarizing layer POL may be formed by coating the substrate SUB with a liquid polarizing material.

The first barrier layer BR1 may be disposed on the polarizing layer POL.

The color filter CF and the black matrix BM may be disposed on the first barrier layer BR1.

The connection line CL may be disposed on the black matrix BM. The connection line CL may be directly arranged on the black matrix BM and overlap with the black matrix BM, so that the connection line CL may be prevented from being viewable in reflections of externally incident light from within the device.

The second barrier layer BR2 may be disposed on the connection line CL.

The first electrode EL1 may be disposed on the second barrier layer BR2. The first electrode EL1 may function as an anode, may inject holes into the emitting layer EML, and may include a material having a high work function. According to various exemplary embodiments, since an image is displayed toward the lower portion of the substrate SUB, the first electrode EL1 may include a transparent conductive material.

The pixel defining layer PDL dividing each of the plurality of pixel areas may be disposed on the first electrode EL1. The pixel defining layer PDL may include a protrusion protruding the pixel circuit PC.

The emitting layer EML may be disposed between the first electrode EL1 and the pixel defining layer PDL.

The second electrode EL2 may be disposed on the emitting layer EML. The second electrode EL2 may function as a cathode and be patterned so as to be provided to each of the plurality of pixel areas. Since an image is provided toward the lower portion of the substrate SUB of the display device, the second electrode EL2 may include an opaque conductive material.

The passivation film PSV may be disposed on the second electrode EL2. The passivation film PSV may include the contact hole H to which the pixel defining layer PDL is inserted and adhered.

At least one thin film transistor may be provided on the passivation film PSV. The thin film transistor including the active pattern ACT may include the drain electrode DE at a position corresponding to the contact hole H, the source electrode SE spaced apart from the drain electrode DE by a predetermined distance, and the gate electrode GE arranged under the source electrode SE and the drain electrode DE. In addition, the thin film transistor may include the active pattern ACT located under the gate electrode GE and partially overlapped with the gate electrode GE. The active pattern ACT may include but is not limited to a semiconductor pattern including an oxide semiconductor. For example, the active pattern ACT may be a semiconductor pattern including a graphene material.

The buffer layer BFL may be disposed over the passivation film PSV. The buffer layer BFL may cover the thin film transistor including the active pattern ACT and prevent diffusion of impurities into the thin film transistor including the active pattern ACT.

The sealing layer SL may be disposed on the buffer layer BFL.

As described above, since the polarizing layer POL, the touch sensor TSP, the organic light emitting layer OLED, and the pixel circuit PC are sequentially formed on the substrate SUB by the roll-to-roll method, a display device may be manufactured without an optically clear adhesive (OCA). In addition, the above display device may be thinned by forming each layer in the form of a thin film.

Figure 17:
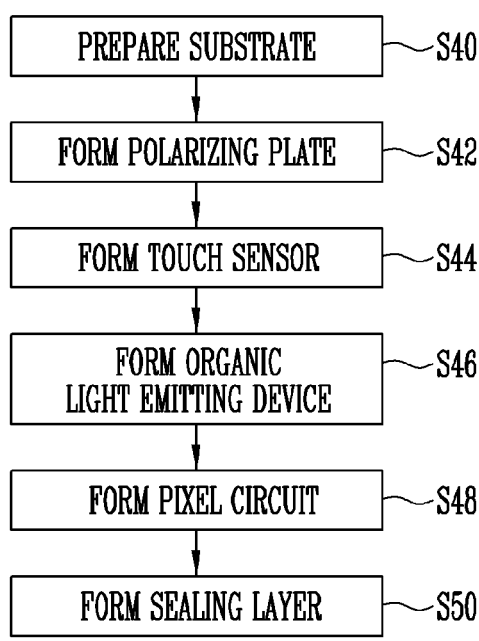
FIG. 17 is a flowchart of an exemplary method of fabricating the display device shown in FIG. 16.

Referring to FIGS. 16 and 17, the substrate SUB may be prepared by a roll-to-roll method (S40). The polarizing layer POL may be formed by coating the substrate SUB with a liquid polarizing material (S42). The thin-film touch sensor TSP may be formed by printing sensing patterns including the connection line CL and the sensing electrodes onto the polarizing layer POL (S44). Subsequently, the organic light emitting layer OLED may be formed on the touch sensor TSP (S46).

Next, the pixel circuit PC may be formed on the organic light emitting layer OLED (S48). The sealing layer SL may be formed to encapsulate the organic light emitting layer OLED (S50).

Through the above-described steps (S40 to S50), the display device according to the seventh exemplary embodiment may be fabricated.

Figure 18:
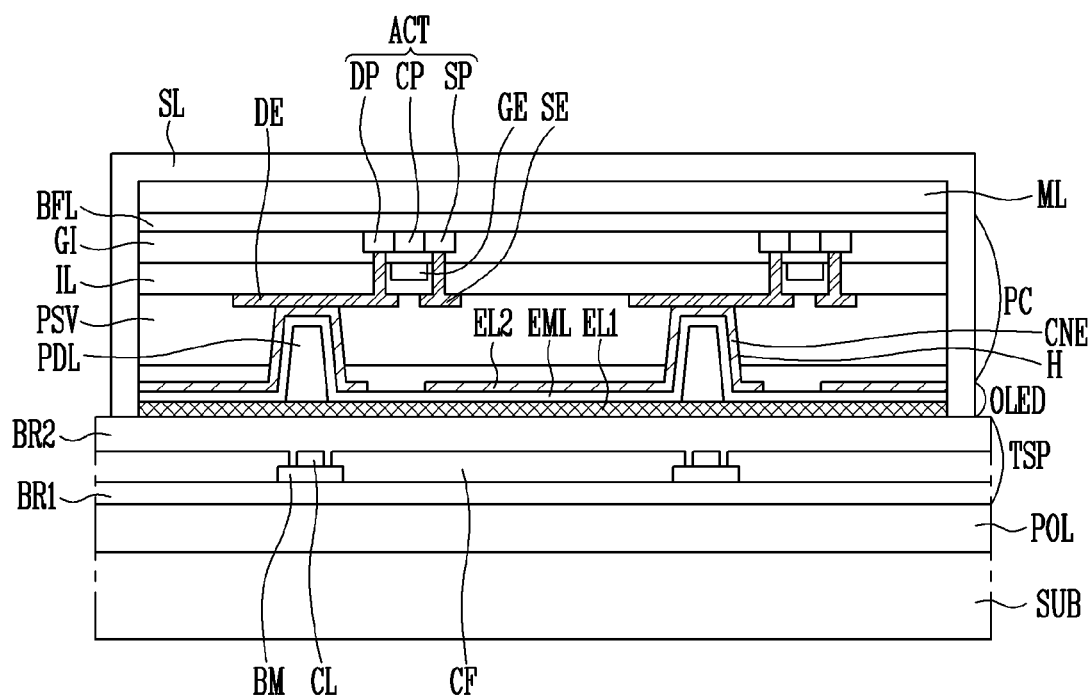
FIG. 18 is a partial cross-sectional view illustrating a display device according to an eighth exemplary embodiment of the invention made by a roll to roll fabrication method.

Referring to FIG. 18, to avoid duplication of description, some of the similarities between the display device according to the eight exemplary embodiment and the display devices according to the earlier described exemplary embodiments will not be described. Portions of the eighth exemplary embodiment which are not particularly described below coincide with corresponding portions of the display devices according to the above-described exemplary embodiments. The same reference numerals refer to the same components and similar reference numerals refer to similar components. The display device according to the eighth exemplary embodiment may include the polarizing layer POL, the touch sensor TSP, the organic light emitting layer OLED, and the pixel circuit PC that are, in various exemplary embodiments, sequentially formed over the substrate SUB by a roll-to-roll method.

A metal layer ML may be disposed on the pixel circuit PC. The metal layer ML may be provided so that a display device according to various exemplary embodiments may be restored to their original shape after being folded. The metal layer ML may include a carbon nanotube having high elasticity or an aluminum metal thin film.

The sealing layer SL may be disposed on the metal layer ML.

According to the above-described exemplary embodiments, pixels may be provided as follows.

Figure 19:
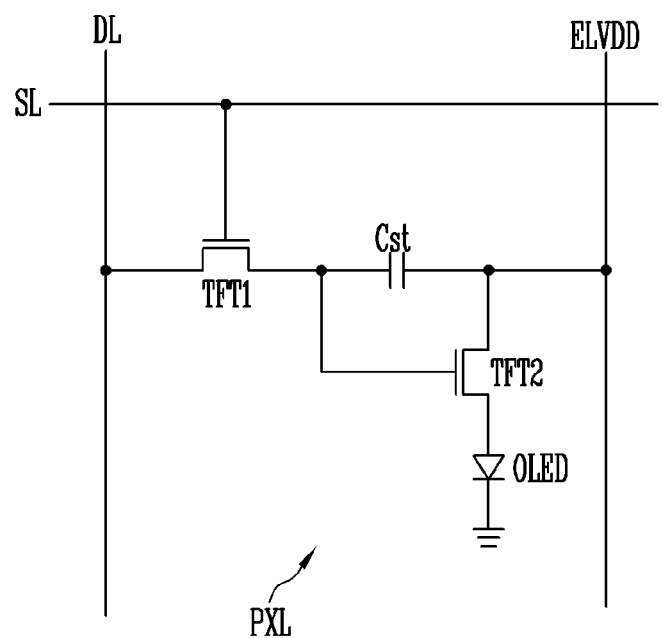
FIG. 19 is a schematic view illustrating an exemplary embodiment of a circuit for a single pixel of the exemplary embodiment of the display device shown in FIG. 2.
Figure 20:
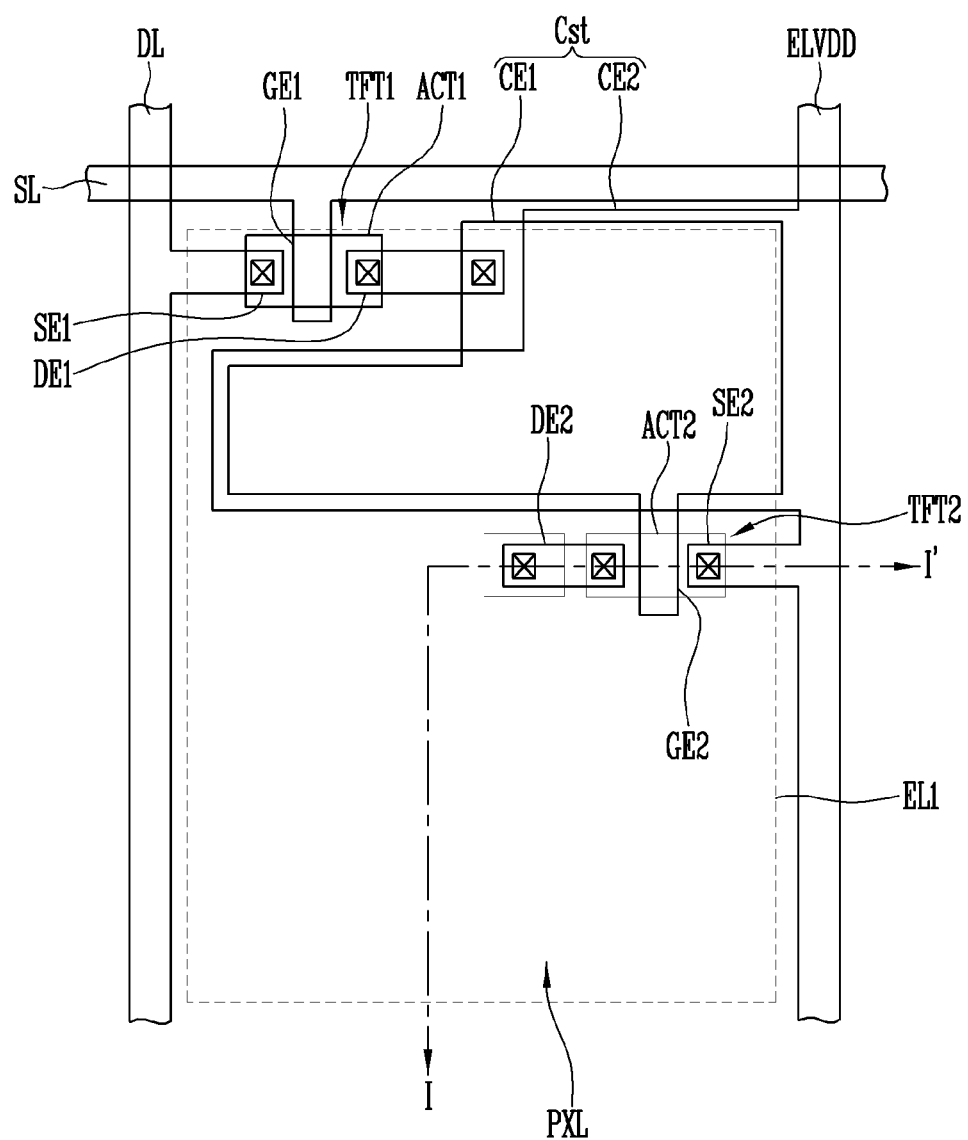
FIG. 20 is a partial plan view illustrating the single pixel shown in FIG. 19.
Figure 21:
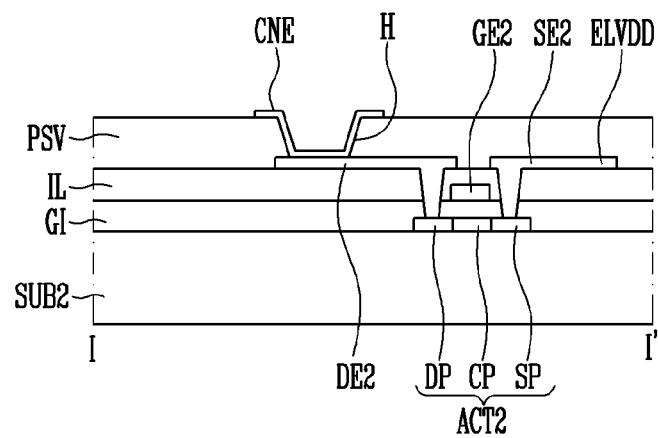
FIG. 21 is a partial cross-sectional view taken along line I-I' of FIG. 20.

Referring to FIGS. 2 and 19 to 22, the display device may include the second substrate SUB2, a wiring unit (discussed in its component parts below), and the pixel PXL. The pixel PXL may display an image. As described above, a plurality of the pixels PXL may be provided and arranged in a matrix format. However, FIGS. 19 and 20 illustrate one pixel PXL for convenience of explanation. FIG. 19 illustrates that the pixel PXL may have a rectangular shape. However, the pixel PXL may be modified into various other shapes.

The pixel PXL may be provided on the second substrate SUB2.

The wiring unit may supply a signal to the pixel PXL and include a scan line SL, a data line DL, and a driving voltage line ELVDD.

The scan line SL may extend in one direction. The data line DL may extend in another direction crossing the scan line SL. The driving voltage line ELVDD may extend in substantially the same direction as one of the scan line SL and the data line DL, for example, the data line DL as depicted in FIG. 19. The scan line SL may transfer a scan signal to the thin film transistor, the data line DL may transfer a data signal to the thin film transistor, and the driving voltage line ELVDD may provide a driving voltage to the thin film transistor.

The pixel PXL may include the thin film transistor connected to the wiring unit, an organic light emitting layer OLED coupled to the thin film transistor, and a capacitor Cst.

The thin film transistor may include a driving thin film transistor TFT2 for controlling the organic light emitting layer OLED and a switching thin film transistor TFT1 for switching the driving thin film transistor TFT2. Thus, according to various exemplary embodiments, the pixel PXL may include the two thin film transistors TFT1 and TFT2 and one capacitor Cst. However, various other arrangements may be used. For example, according to other exemplary embodiments, one pixel PXL may include one thin film transistor or three or more thin film transistors, for example, seven thin film transistors. The number of capacitors may also be changed.

Referring to FIG. 20, the switching thin film transistor TFT1 may include a first gate electrode GE1, a first source electrode SE1, and a first drain electrode DE1. The first gate electrode GE1 may be connected to the scan line SL. The first source electrode SE1 may be connected to the data line DL. The first drain electrode DE1 may be coupled to a gate electrode (i.e., second gate electrode GE2) of the driving thin film transistor TFT2. The switching thin film transistor TFT1 may transfer a data signal applied to the data line DL to the driving thin film transistor TFT2 in response to a scan signal applied to the scan line SL.

The driving thin film transistor TFT2 may include a second gate electrode GE2, a second source electrode SE2, and a second drain electrode DE2. The second gate electrode GE2 may be connected to the switching thin film transistor TFT1. The second source electrode SE2 may be connected to the driving voltage line ELVDD. The second drain electrode DE2 may be connected to the organic light emitting layer OLED.

The switching thin film transistor TFT1 and the driving thin film transistor TFT2 may include the first active pattern ACT1 and the second active pattern ACT2 including semiconductor materials, respectively. Each of the first active pattern ACT1 and the second active pattern ACT2 may include the source portion SP, the drain portion DP, and the channel portion CP. The first active pattern ACT1 and the second active pattern ACT2 may include doped or undoped silicon, for example, poly silicon or amorphous silicon, and may be a semiconductor pattern including an oxide semiconductor.

The organic light emitting layer OLED may include the emitting layer EML, and the first electrode EL1 and the second electrode EL2 opposing each other with the emitting layer EML interposed therebetween. The first electrode EL1 may be connected to the second drain electrode DE2 of the driving thin film transistor TFT2. The first electrode EL1 may function as an anode, be provided to inject holes into the conductor(s), and may include a material having a high work function. For example, the first electrode EL1 may include a transparent conductive material, such as an indium tin oxide (ITO), an indium zinc oxide (IZO), a zinc oxide (ZnO), or an indium tin zinc oxide (ITZO).

The emitting layer EML may emit light in response to an output signal from the driving thin film transistor TFT2 and may, or may not, display an image by emitting light. Light emitted from the emitting layer EML may have varying characteristics depending on the material of the emitting layer EML and may, for example, be colored light or white light. According to various exemplary embodiments, the emitting layer EML may be an organic light emitting material displaying white light.

A common voltage may be applied to the second electrode EL2 and arranged at a position corresponding to the pixel PXL. The second electrode EL2 may function as a cathode and include an opaque conductive material having a lower work function than the first electrode EL1. For example, the second electrode EL2 may include an opaque conductive material such as Ag, Mg, Al, Pt, Pd, Au, Ni, Nd, Ir, Cr, Li or Ca.

Figure 22:
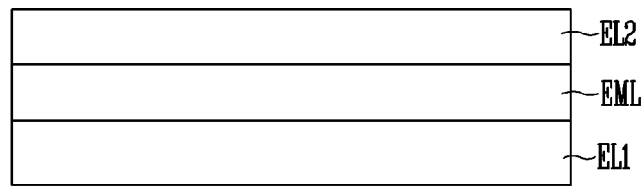
FIG. 22 is a schematic cross-sectional view of the exemplary embodiment of an organic light emitting layer having the single pixel circuit shown in FIG. 19.
Figure 23:
FIG. 23 is a detailed, schematic cross-sectional view of the exemplary embodiment of the organic light emitting layer shown in FIG. 22.

Referring to FIGS. 22 and 23, the organic light emitting layer OLED may include a hole injection layer HIL arranged between the first electrode EL1 and the emitting layer EML and a hole transport layer HTL arranged between the hole injection layer HIL and the emitting layer EML.

The hole injection layer HIL may facilitate injection of holes into the emitting layer EML. The hole injection layer HIL may include a p type dopant to improve a rate at which the holes are injected. The p type dopant may, in various exemplary embodiments, include at least one of $MoO_3$, $MoO_2$, $WO_2$, $V_2O_5$, $ReO_3$, NiO, $Mo(tfd)_3$, HAT-CN and $F_4$-TCNQ. The hole transport layer HTL may be arranged on the hole injection layer HIL, receive holes from the hole injection layer HIL, and transport the holes to the emitting layer EML.

The hole injection layer HIL and the hole transport layer HTL may be selectively omitted depending on the types of materials forming the emitting layer EML.

In addition, the organic light emitting layer OLED may further include an electron injection layer EIL arranged between the second electrode EL2 and the emitting layer EML and an electron transport layer ETL arranged between the electron injection layer EIL and the emitting layer EML.

The electron injection layer EIL may facilitate injection of holes into the emitting layer EML. The electron transport layer ETL may be arranged on the electron injection layer EIL, receive electrons from the electron injection layer EIL, and transport the electrons to the emitting layer EML. The electron injection layer EIL and the electron transport layer ETL may be selectively omitted depending on the types of materials forming the emitting layer EML.

The capacitor Cst may be connected between the second gate electrode GE2 and the second source electrode SE2 of the driving thin film transistor TFT2, and may charge and maintain a data signal input to the second gate electrode GE2 of the driving thin film transistor TFT2.

The passivation film PSV may be formed on the switching thin film transistor TFT1 and the driving thin film transistor TFT2. The passivation film PSV may cover the switching thin film transistor TFT1 and the driving thin film transistor TFT2 and may include at least one layer. The passivation film PSV may include the contact hole H through which a portion of the second drain electrode DE2 is externally exposed.

The contact electrode CNE may be disposed on the passivation film PSV. The contact electrode CNE may be arranged in the contact hole H of the passivation film PSV and electrically connected to the second drain electrode DE2 of the driving thin film transistor TFT2.

According to the above-described exemplary embodiments, the color filters and the black matrix of the touch sensor may be configured as follows.

Figure 24:
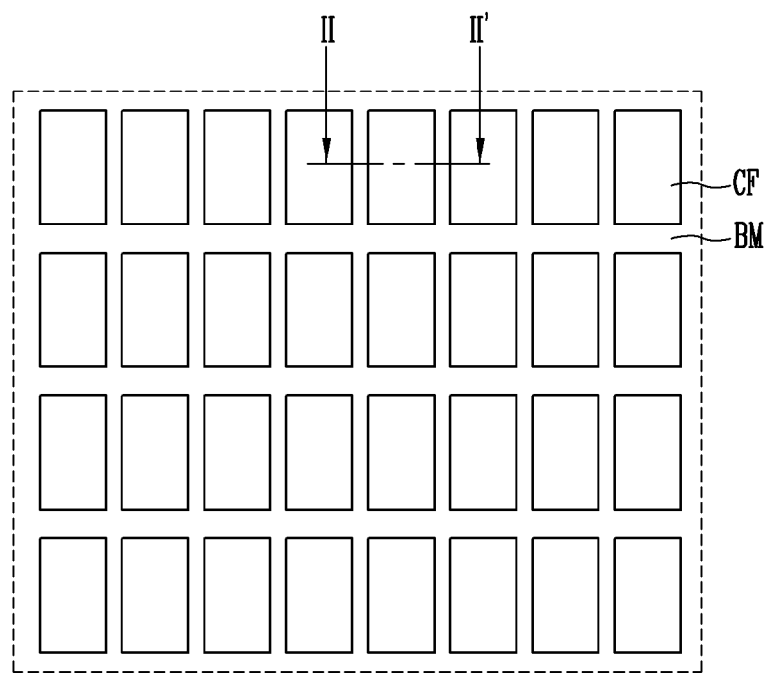
FIG. 24 is a plan view of an exemplary embodiment of color filters and a black matrix of a touch sensor of the exemplary embodiment of the display device shown in FIG. 10.
Figure 25:
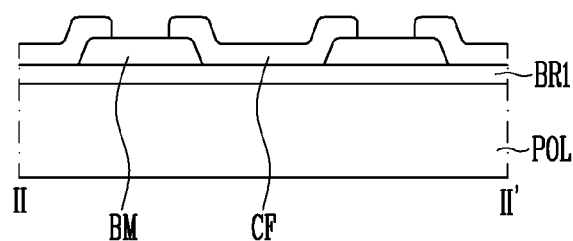
FIG. 25 is a partial cross-sectional view taken along line II-IF of FIG. 24.

Referring to FIGS. 10, 24 and 25, the first barrier layer BR1, the color filters CF, and the black matrix BM may be provided over the polarizing layer POL.

The color filters CF may give color to light transmitting through the plurality of pixel areas. The color filter CF may, in various exemplary embodiments, be one of a red color filter, a green color filter, and a blue color filter. In addition, the color filter CF may be a cyan color filter, a magenta color filter, and a yellow color filter. The black matrix BM may be provided at one side of each color filter CF on the first barrier layer BR1 to divide the color filters CF. In addition, the black matrix BM may block unnecessary light when the display device displays an image.

According to the above-described exemplary embodiments, the touch sensor may be configured as follows.

Figure 26:
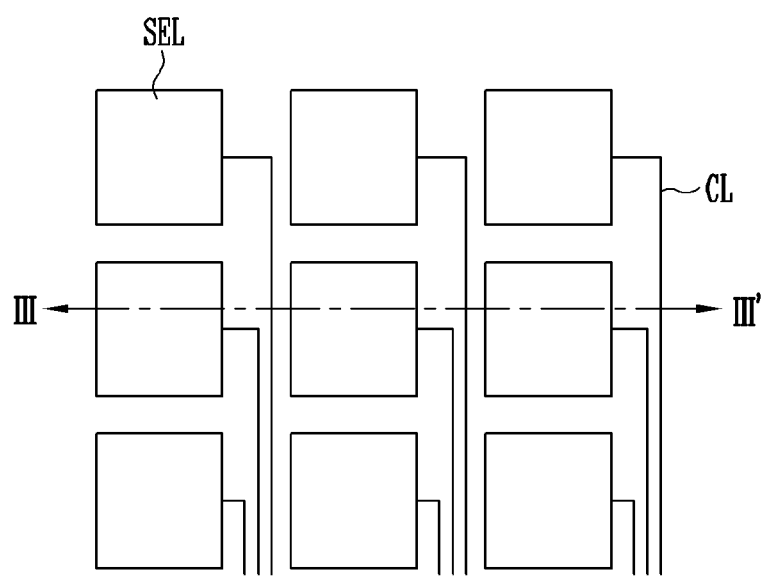
FIG. 26 is a partial plan view of an exemplary embodiment of a portion of the touch sensor of the exemplary embodiment of the display device shown in FIG. 10 where the touch sensor is a self-capacitance touch sensor.
Figure 27:
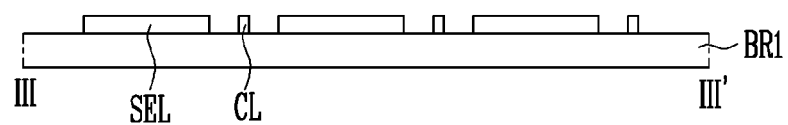
FIG. 27 is a cross-sectional view taken along line of FIG. 26.
Figure 28:
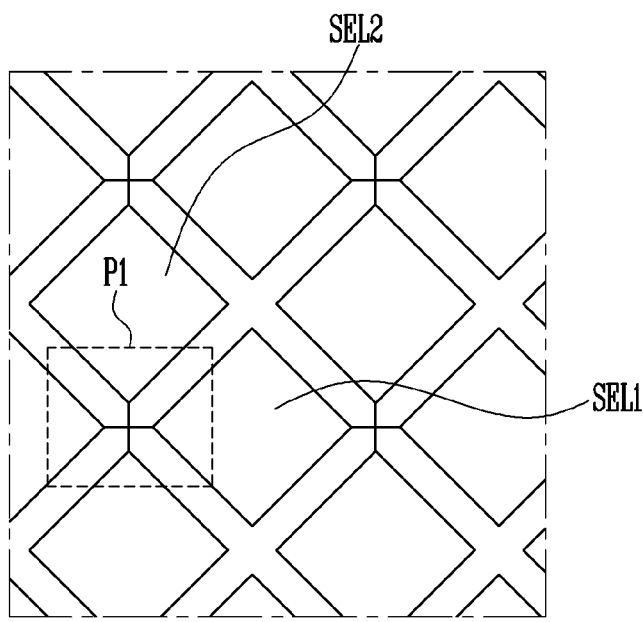
FIG. 28 is a partial plan view of an exemplary embodiment of a portion of the touch sensor of the exemplary embodiment of the display device shown in FIG. 10 where the touch sensor is a mutual capacitance touch sensor.
Figure 29:
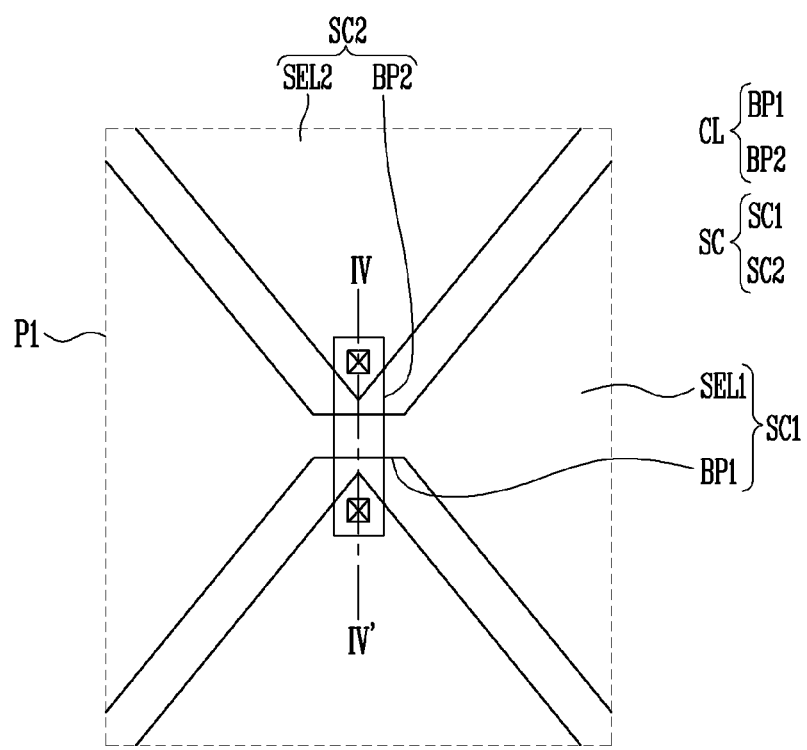
FIG. 29 is an enlarged plan view of a portion P1 of FIG. 28.
Figure 30:
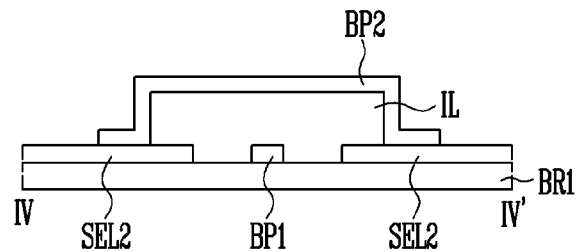
FIG. 30 is a cross-sectional view taken along line IV-IV' of FIG. 29.

Referring to FIGS. 2, 26 and 27, the touch sensor TSP may include sensing electrodes SEL arranged in a matrix format. A predetermined voltage may be applied to the sensing electrodes SEL. The connection line CL may be connected to each sensing electrode SEL and a predetermined voltage may be applied through the connection line CL. When a user's touch is made upon the touch sensor TSP, capacitance of the touched portion of the sensing electrode SEL may be changed. By obtaining the changes in the predetermined voltage by the changes in capacitance, whether or not a touch is made at a predetermined portion may be determined.

Each of the sensing electrodes SEL and the connection lines CL of the touch sensor TSP according to various exemplary embodiments may be provided over the first barrier layer BR1. The connection line CL may be disposed on the black matrix BM. In other words, the connection line CL may be directly arranged over the black matrix BM and overlap with the black matrix BM, so that the connection line CL may be prevented from being viewed by externally incident light.

Referring to FIGS. 2 and 28 to 30, the touch sensor TSP may include a sensing cell SC and the connection line CL. The connection line CL may be connected to the sensing cell SC and electrically connect the sensing cell SC to an external driving circuit (not illustrated).

The sensing cell SC may include a first sensing cell SC1 and a second sensing cell SC2. The first sensing cell SC1 may include first sensing electrodes SEL1 extending in a first direction and a first bridge pattern BP1 connecting the first sensing electrodes SEL1 to each other. The second sensing cell SC2 may include second sensing electrodes SEL2 extending in a second direction crossing the first direction and a second bridge pattern BP2 connecting the second sensing electrodes SEL2 to each other. The first bridge pattern BP1 connecting the first sensing electrodes SEL1 to each other and the second bridge pattern BP2 connecting the second sensing electrodes SEL2 may be included in the connection line CL.

The first sensing electrodes SEL1 and the second sensing electrodes SEL2 may be formed into independent patterns which are not connected to each other. When the first sensing electrodes SEL1 are connected to each other by the first bridge pattern BP1 formed integrally with the first sensing electrodes SEL1, the second sensing electrodes SEL2 may be connected to each other by the second bridge pattern BP2 separated by a interlayer insulating layer IL.

One of the first sensing electrodes SEL1 and the second sensing electrodes SEL2 may be driving electrodes and the other sensing electrodes may serve as sensing electrodes.

All of the first sensing electrodes SEL1, the second sensing electrodes SEL2, and the connection line CL of the touch sensor TSP according to an exemplary embodiment may be provided on the first barrier layer BR1. The connection line CL may be provided on the black matrix BM.

Figure 31:
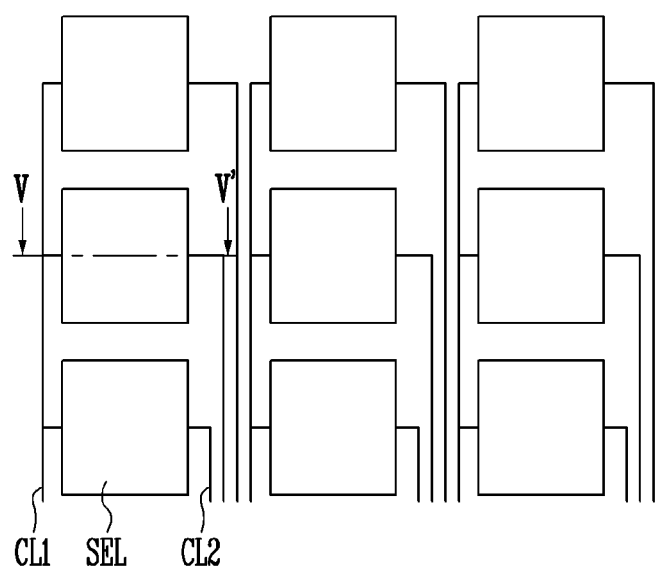
FIG. 31 is a partial plan view of an exemplary embodiment of a portion of the touch sensor of the exemplary embodiment of the display device shown in FIG. 10 where the touch sensor is a piezoresistive sensor.
Figure 32:
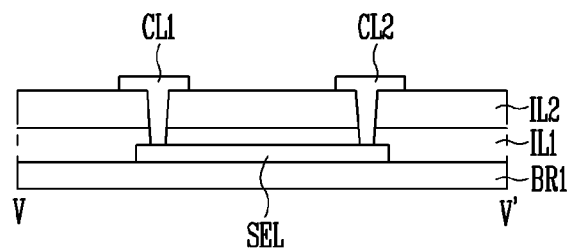
FIG. 32 is a cross-sectional view taken along line V-V' of FIG. 31.

Referring to FIGS. 10, 31 and 32, the touch sensor TSP may include the sensing electrodes SEL including materials whose resistances vary depending on pressure being applied thereto. The sensing electrodes SEL may be arranged in a matrix format. Connection lines may be coupled to the sensing electrodes SEL and include a first connection line CL1 connected to one side of the sensing electrodes SEL and a second connection line CL2 connected to the other side thereof. According to various exemplary embodiments, when a user's touch is made upon the touch sensor TSP, the resistance of the sensing electrode SEL corresponding to the touched portion may change. Thus, whether the user touches the touch sensor TSP at a predetermined position may be determined based on the changes in the resistance of the sensing electrode.

The sensing electrodes SEL may be provided on the first barrier layer BR1. The connection lines, i.e., the first connection lines CL1 and the second connection lines CL2 may be provided on a second insulating layer IL2 and connected to the respective sensing electrodes SEL corresponding thereto through contact holes formed in a first insulating layer IL1 and the second insulating layer IL2.

According to the principles of the invention and various exemplary embodiments thereof, a thinner display device and/or a more easily foldable display device may be provided.

According to the principles of the invention and various exemplary embodiments thereof, a method of fabricating a thinner and/or more easily foldable display device may be provided.

Although certain exemplary embodiments and implementations have been described herein, other embodiments and modifications will be apparent from this description. Accordingly, the inventive concept is not limited to such embodiments, but rather to the broader scope of the appended claims and various obvious modifications and equivalent arrangements.

What is claimed is:

1. A method of fabricating a display device, the method comprising:
    forming an organic light emitting layer on a first substrate;
    forming a pixel circuit on a second substrate;
    forming a conductive adhesive on the pixel circuit; and
    coupling the organic light emitting layer and the pixel circuit to each other by adhesion through the use of the conductive adhesive.

2. The method of claim 1, wherein the step of coupling the organic light emitting layer and the pixel circuit to each other comprises disposing the conductive adhesive between the organic light emitting layer and the pixel circuit.

3. The method of claim 2, wherein the organic light emitting layer includes a protrusion protruding in a direction of the pixel circuit, the pixel circuit includes a recess, and the protrusion is inserted into the recess when the organic light emitting layer and the pixel circuit are coupled to each other.

4. The method of claim 3, wherein the step of forming of the organic light emitting layer comprises:
    forming a first electrode on the first substrate;
    forming a pixel defining layer dividing a pixel area on the first substrate;
    forming an organic emitting layer on the first electrode; and
    forming a second electrode on the organic emitting layer,
    wherein the protrusion is the pixel defining layer.

5. The method of claim 1, wherein the step of coupling electrically couples the organic light emitting layer and the pixel circuit to each other.

6. The method of claim 1, further comprising forming a pressure sensing electrode on a second substrate before forming the pixel circuit.

* * * * *